United States Patent
Yoon et al.

(10) Patent No.: US 10,607,855 B2
(45) Date of Patent: Mar. 31, 2020

(54) METHOD FOR FABRICATING SEMICONDUCTOR DEVICE USING A HYBRID MASK PATTERN

(71) Applicant: SAMSUNG ELECTRONICS CO., LTD., Suwon-si, Gyeonggi-do (KR)

(72) Inventors: Jun Ho Yoon, Suwon-si (KR); Jae Hong Park, Seongnam-si (KR); Da Il Eom, Goyang-si (KR); Sung Yeon Kim, Jeongeup-si (KR); Jin Young Park, Anyang-si (KR); Yong Moon Jang, Incheon (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 151 days.

(21) Appl. No.: 15/862,541

(22) Filed: Jan. 4, 2018

(65) Prior Publication Data

US 2019/0027376 A1 Jan. 24, 2019

(30) Foreign Application Priority Data

Jul. 19, 2017 (KR) .................. 10-2017-0091479

(51) Int. Cl.
*H01L 21/3213* (2006.01)
*H01L 21/308* (2006.01)
(Continued)

(52) U.S. Cl.
CPC ...... *H01L 21/32139* (2013.01); *G03F 1/0053* (2013.01); *H01L 21/0337* (2013.01);
(Continued)

(58) Field of Classification Search
CPC .......... H01L 21/32139; H01L 21/0337; H01L 21/3081; H01L 21/3086; H01L 21/31144;
(Continued)

(56) References Cited

U.S. PATENT DOCUMENTS 9,012,326 B2 4/2015 Kim et al.
9,018,103 B2 4/2015 Guha et al.
(Continued)

FOREIGN PATENT DOCUMENTS

KR 20070083383 A 8/2007

*Primary Examiner* — Mark W Tornow
*Assistant Examiner* — Abbigale A Boyle
(74) *Attorney, Agent, or Firm* — Volentine, Whitt & Francos, PLLC

(57) ABSTRACT

A method for fabricating a semiconductor device includes forming an insulating layer on a substrate; forming a first mask pattern including silicon on the insulating layer and forming a second mask pattern including an oxide on the first mask pattern; forming a coating layer that includes carbon and which covers an upper surface of the insulating layer, a sidewall of the first mask pattern, and the second mask pattern; removing a portion of the coating layer and the second mask pattern; forming a metal layer on an upper surface of the first mask pattern and on a sidewall of the coating layer; exposing the upper surface of the insulating layer by removing the coating layer; and etching the insulating layer by using the first mask pattern and the metal layer as a mask.

20 Claims, 24 Drawing Sheets

(51) Int. Cl.
    *H01L 21/311*     (2006.01)
    *H01L 27/108*     (2006.01)
    *G03F 1/00*     (2012.01)
    *H01L 21/304*     (2006.01)
    *H01L 49/02*     (2006.01)
    *H01L 21/033*     (2006.01)

(52) U.S. Cl.
CPC ........ *H01L 21/304* (2013.01); *H01L 21/3081* (2013.01); *H01L 21/3086* (2013.01); *H01L 21/31144* (2013.01); *H01L 27/108* (2013.01); *H01L 27/10852* (2013.01); *H01L 28/90* (2013.01)

(58) Field of Classification Search
CPC . H01L 27/108; H01L 27/10852; H01L 28/90; G03F 1/0053; G03F 7/0035; G03F 1/0046
See application file for complete search history.

(56) References Cited

U.S. PATENT DOCUMENTS

| | | | |
|---|---|---|---|
| 9,070,640 B2 * | 6/2015 | Gwak | H01L 21/31144 |
| 9,129,906 B2 | 9/2015 | Wu et al. | |
| 9,263,297 B2 * | 2/2016 | deVilliers | H01L 21/32133 |
| 9,337,121 B2 | 5/2016 | Jun et al. | |
| 9,520,295 B2 | 12/2016 | Shaikh et al. | |
| 9,520,406 B2 | 12/2016 | Makala et al. | |
| 9,704,722 B2 * | 7/2017 | Park | H01L 21/31144 |
| 9,837,272 B2 * | 12/2017 | Park | H01L 21/0337 |
| 2016/0314983 A1 | 10/2016 | Han et al. | |

* cited by examiner

METHOD FOR FABRICATING SEMICONDUCTOR DEVICE USING A HYBRID MASK PATTERN

A claim for priority is made to Korean Patent Application No. 10-2017-0091479 filed on Jul. 19, 2017 in the Korean Intellectual Property Office, the entire contents of which are hereby incorporated by reference.

BACKGROUND

The inventive concepts described herein relate to a method for fabricating a semiconductor device using a hybrid mask pattern.

The integration density of memory devices has recently increased due to the rapid development of miniaturized semiconductor processing technology. Consequently, unit cell area of memory devices has been greatly reduced and operating voltage lowered. For example, in the case of semiconductor elements such as dynamic random access memory (DRAM), along with the increase in degree of integration and the reduction of area occupied by semiconductor elements such as DRAM, it is necessary to maintain or increase capacitance. In order to meet the need of increased capacitance, the aspect ratio of cylindrical type lower electrodes have greatly increased. However, as a result of increased aspect ratio a problem that typically arises is that the cylindrical type lower electrodes fall down or are broken before dielectric is deposited.

SUMMARY

Exemplary embodiments of the inventive concept provide a method for fabricating a semiconductor device that enhances productivity by using a hybrid mask pattern including a silicon mask and a metal layer.

Embodiments of the inventive concept provide a method for fabricating a semiconductor device including forming an insulating layer over a substrate; forming a first mask pattern comprising silicon on the insulating layer and forming a second mask pattern including an oxide on the first mask pattern; forming a coating layer that includes carbon and that covers an upper surface of the insulating layer exposed through the first and second mask patterns, sidewalls of the first mask pattern, and the second mask pattern; removing a portion of the coating layer and the second mask pattern to provide remaining parts of the coating layer; forming a metal layer on an upper surface of the first mask pattern, and on sidewalls of the remaining parts of the coating layer; exposing the upper surface of the insulating layer by removing the remaining parts of the coating layer; and etching the insulating layer using the first mask pattern and the metal layer as a mask.

Embodiments of the inventive concept further provide a method for fabricating a semiconductor device including forming an insulating layer including a first mold film, a first supporter film, a second mold film, and a second supporter film are stacked in sequence over a substrate; forming a first mask pattern on the insulating layer and forming a second mask pattern on the first mask pattern; forming a coating layer covering an upper surface of the insulating layer, a sidewall of the first mask pattern, and the second mask pattern; exposing a portion of a sidewall of the coating layer and an upper surface of the first mask pattern by removing a portion of the coating layer and the second mask pattern, to provide a remaining part of the coating layer; forming a metal layer on the upper surface of the first mask pattern; exposing the upper surface of the insulating layer by removing the remaining part of the coating layer; etching a portion of the insulating layer using the first mask pattern and the metal layer as a mask; exposing the upper surface of the first mask pattern by removing the metal layer; and forming a contact hole in the insulating layer by etching an other portion of the insulating layer using the first mask pattern as a mask.

Embodiments of the inventive concept also provide a method for fabricating a semiconductor device including forming an insulating layer on a substrate; forming a first mask pattern and a second mask pattern stacked on the insulating layer in sequence, each of the first mask pattern and the second mask pattern comprising a first opening, a second opening spaced apart from the first opening in a first direction, and a third opening spaced apart from the first opening in a second direction different from the first direction; forming a coating layer including carbon to fill the first to third openings; removing the second mask pattern; forming a metal layer overlapping on the first mask pattern; exposing an upper surface of the insulating layer through the first to third openings by removing the coating layer; forming contact holes in the insulating layer using the first mask pattern and the metal layer as a mask; and forming lower electrodes in the contact holes.

Embodiments of the inventive concept are not limited to those set forth above and objects other than those set forth above will be clearly understood to a person skilled in the art from the following description.

BRIEF DESCRIPTION OF THE DRAWINGS

The above and other exemplary embodiments, features and advantages of the inventive concept will become more apparent to those of ordinary skill in the art in view of the following detailed description with reference to the accompanying drawings, in which.

DETAILED DESCRIPTION

Hereinafter, with reference to FIG. 1 and FIG. 2, a semiconductor device fabricated by a fabricating method of a semiconductor device according to example embodiments of the inventive concept will be described.

Figure 1:
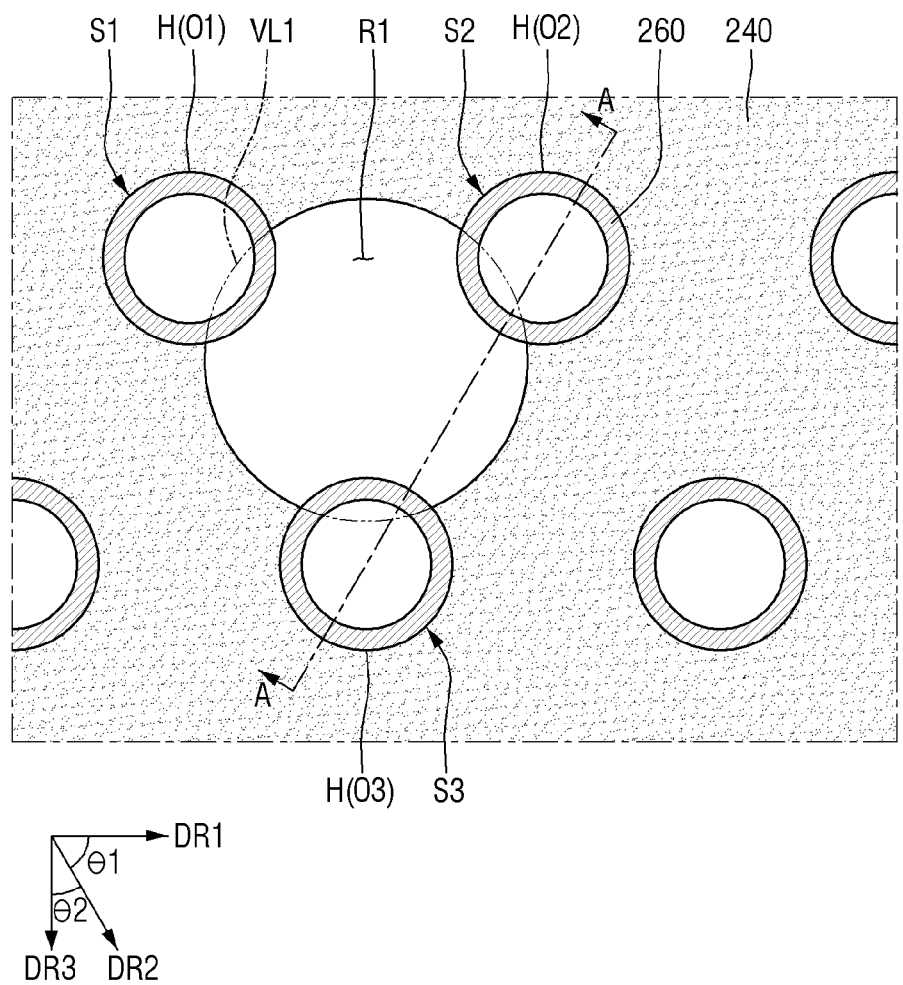
FIG. 1 illustrates a top planar view of a semiconductor device fabricated according to a fabricating method of a semiconductor device according to example embodiments of the inventive concept.

FIG. 1 illustrates a top planar view of a semiconductor device fabricated according to a fabricating method of a semiconductor device according to example embodiments of the inventive concept. FIG. 2 illustrates a cross-sectional view taken on line A-A of FIG. 1. The semiconductor device may for example be a dynamic random access memory (DRAM) including a cylindrical lower electrode.

Figure 2:
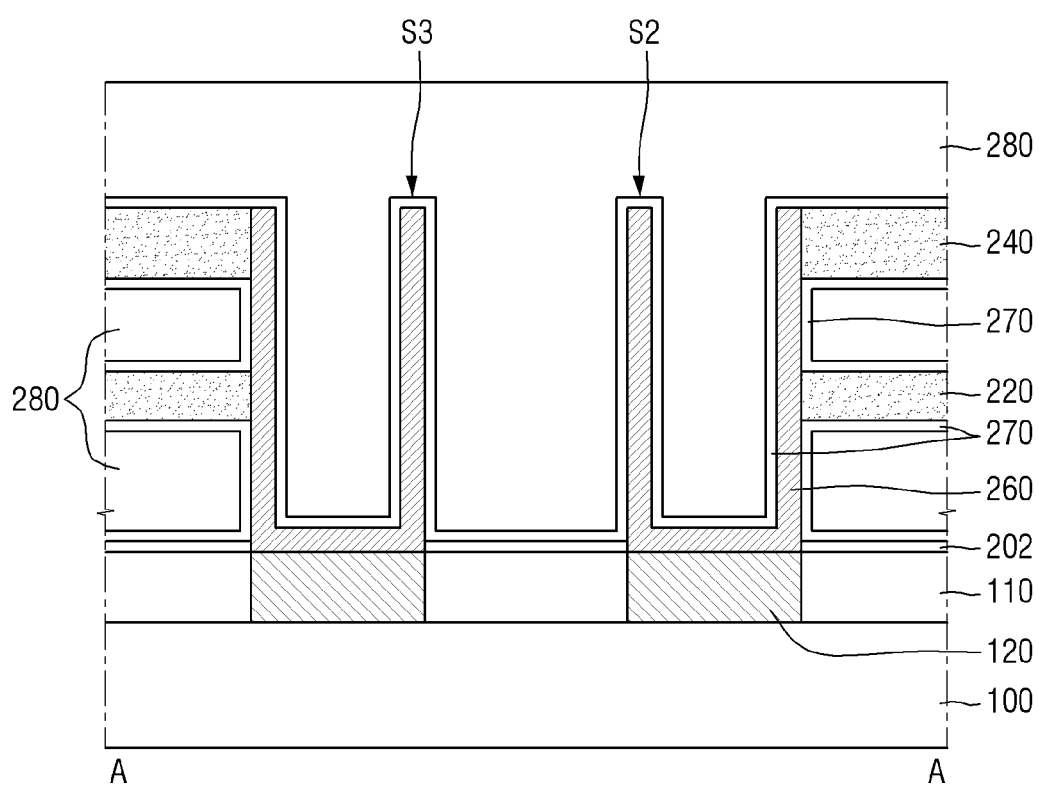
FIG. 2 illustrates a cross-sectional view taken on line A-A of FIG. 1.

Referring to FIG. 1 and FIG. 2, the semiconductor device fabricated by the fabricating method of the semiconductor device according to example embodiments of the inventive concept includes a substrate 100, an interlayer insulating film 110, a contact plug 120, an etch stop film 202, a first supporter pattern 220, a second supporter pattern 240, a lower electrode 260, a capacitor dielectric film 270, and an upper electrode 280.

The semiconductor device may include a plurality of structures which are arranged spaced apart from one another. For example, the first structure S1 and the second structure S2 may be arranged spaced apart from each other along a first direction DR1. In addition, the third structure S3 may be disposed spaced apart from the first structure S1 along a second direction DR2.

An angle θ1 formed by the first direction DR1 and the second direction DR2 may be an acute angle. For example, the angle θ1 between the first direction DR1 and the second direction DR2 may be 60 degrees, and consequently the angle θ2 between the second direction DR2 and the third direction DR3 may be 30 degrees. In this case, the respective structures may be arranged at the vertexes and the center of a honeycomb-shaped hexagon. However, the respective structures are not limited as arranged together in a honeycomb-shaped hexagon, and in other embodiments the respective structures may be arranged together in different shapes and/or configurations.

Moreover, although the respective structures are shown in FIG. 1 as spaced apart from one another by a same pitch, the inventive concept is not limited thereto. That is, in some other example embodiments, at least one of the spaced pitches between the respective structures may be different.

Each of the cylindrical-shaped first to third structures S1, S2, and S3 includes the lower electrode 260 disposed along the inner wall of the inside thereof, the capacitor dielectric film 270 disposed on the lower electrode 260, and the upper electrode 280 disposed on the capacitor dielectric film 270. However, it should be understood that the capacitor dielectric film 270 and the upper electrode 280 are omitted from FIG. 1 for convenience of explanation.

The plurality of supporter patterns support the respective structures. Specifically, a mid-supporter pattern, that is the first supporter pattern 220, may be disposed over the substrate 100 to support the first to third structures S1, S2, and S3. The first supporter pattern 220 may include an open region R1 exposing a portion of the sidewall of each of the first to third structures S1, S2, and S3, and a support region surrounding other portions of the sidewall of each of the first to third structures S1, S2, and S3. The first supporter pattern 220 supports the first to third structures S1, S2, and S3 using the support region.

Although the open region R1 of the first supporter pattern 220 is shown in FIG. 1 as formed only between the first to third structures S1, S2, and S3, this is merely for convenience of explanation and it should be understood that the inventive concept is not limited thereto. That is, the first supporter pattern 220 may be formed to include additional open regions R1 between other adjacent structures.

The open region R1 of the first supporter pattern 220 may have a circular shape. Specifically, the sidewall of the open region R1 of the first supporter pattern 220 may be formed along a first virtual line VL1 of a circular shape. However, the first supporter pattern 220 is not limited as having a circular shape. That is, in other embodiments, the open region R1 of the first supporter pattern 220 may be formed along a virtual line of a rectangular shape or along a virtual line having the shape of a parallelogram, for example.

In addition to the first supporter pattern (i.e., mid-supporter pattern) 220, a top supporter pattern, that is the second supporter pattern 240, may be disposed over the first supporter pattern 220 to further support the first to third structures S1, S2, and S3. The second supporter pattern 240 may include the open region R1 exposing a portion of the sidewall of each of the first to third structures S1, S2, and S3, and a support region surrounding other portions of the sidewall of each of the first to third structures S1, S2, and S3. The second supporter pattern 240 supports the first to third structures S1, S2, and S3 using the support region.

Although the open region R1 of the second supporter pattern 240 is shown in FIG. 1 as formed only between the first to third structures S1, S2, and S3, this is merely for convenience of explanation and it should be understood that the present disclosure is not limited thereto. That is, the second supporter pattern 240 may be formed to include additional open regions R1 between other adjacent structures.

The open region R1 of the second supporter pattern 240 may have a circular shape. Specifically, the sidewall of the open region R1 of the second supporter pattern 240 may be formed along the first virtual line VL1 of the circular shape. However, the second supporter pattern 240 is not limited to having circular shape. That is, in other embodiments, the open region R1 of the second supporter pattern 240 may be formed along a virtual line of a rectangular shape or along a virtual line having the shape of a parallelogram, for example.

Each of the first supporter pattern 220 and the second supporter pattern 240 may include, for example, at least one of silicon oxynitride (SiON), silicon nitride (SiN), silicon carbon nitride (SiCN), and tantalum oxide (TaO), or the like.

In this case, the first supporter pattern 220 and the second supporter pattern 240 may include a same material, although the inventive concept is not limited thereto. That is, in other embodiments, the first supporter pattern 220 and the second supporter pattern 240 may include different materials. Also, although the plurality of supporter patterns as shown in FIG. 2 includes the first supporter pattern 220 and the second supporter pattern 240, in other embodiments of the inventive concept the plurality of supporter patterns may include more than two supporter patterns.

Referring to FIG. 2, the substrate 100 may be a structure in which a base substrate and an epitaxial layer are stacked, although the inventive concept is not limited thereto. That is, in other embodiments, the substrate 100 may for example be any one of a silicon substrate, a gallium arsenide substrate, a silicon germanium substrate, a ceramic substrate, a quartz substrate, or a glass substrate for display, and a semiconductor on insulator (SOI) substrate. Hereinbelow, the substrate 100 will be described as a silicon substrate as an example. The substrate 100 may be a first conductive type (for example, a P type), although the inventive concept is not limited thereto. That is, in other embodiments the substrate 100 may be a second conductive type (an N type).

Although not illustrated, a gate electrode used as a bit line and a word line may for example be disposed between the substrate 100 and the lower electrode 260. A unit activation region and an element isolation region may be formed in the substrate 100. For example, two transistors may be formed in a single unit activation region.

The interlayer insulating film 110 is formed on or over the substrate 100. The interlayer insulating film 110 may include, for example, at least one of silicon oxide ($SiO_2$), silicon nitride (SiN), and silicon oxynitride (SiON), or the like. The interlayer insulating film 110 may be a single layer or a multi-layer.

The contact plug 120 as shown is formed in the interlayer insulating film 110 to penetrate through the interlayer insulating film 110. The contact plug 120 may be electrically connected with a source/drain region formed in the substrate 100, such as in a unit activation region for example. The etch stop film 202, which will be subsequently described, is shown as disposed on the interlayer insulating film 110.

The contact plug 120 may include a conductive material, and for example, may include at least one of poly crystal silicon, a metal silicide compound, conductive metal nitride, and metal. However, the inventive concept is not limited thereto. That is, the contact plug 120 may be formed of other conductive materials.

The lower electrode 260 may be formed on the substrate 100. For example, the lower electrode 260 may be formed on the contact plug 120 formed in the interlayer insulating film 110. The lower electrode 260 may be electrically connected with the contact plug 120 formed on the lower portion thereof. The lower electrode 260 may be formed as extending in a perpendicular direction to a plane on which the substrate 100 is disposed. That is, the lower electrode 260 may extend lengthways in a thickness direction of the substrate 100.

The lower electrode 260 may have a cylindrical shape, for example. In this case, in some embodiments of the inventive concept, the sidewall of the lower electrode 260 having the cylindrical shape may have a uniform slope profile as illustrated in FIG. 2. That is, the sidewall of the lower electrode 260 may extend substantially and uniformly in a perpendicular direction to a plane on which the substrate 100 is disposed. However, the inventive concept is not limited thereto. That is, in other embodiments, in the case of the sidewall of the lower electrode 260 having the cylindrical shape, the sidewall of the lower electrode 260 may be stepped so as to have the shape of a staircase.

The lower electrodes 260 may for example include at least one selected from doped poly silicon, conductive metal nitride (e.g., titanium nitride, tantalum nitride, tungsten nitride, or the like), metal (e.g., ruthenium, iridium, titanium, tantalum, or the like), and conductive metal oxide (e.g., iridium oxide or the like).

The first supporter pattern 220 and the second supporter pattern 240 may be disposed between adjacent lower electrodes 260. However, the first supporter pattern 220 and the second supporter pattern 240 are not be disposed in the open region R1 formed among the first to third structures S1, S2, and S3 as illustrated in FIG. 1 and FIG. 2. The first supporter pattern 220 and the second supporter pattern 240 may be in direct contact with the lower electrode 260, for example. However, the inventive concept is not limited thereto. That is, in other embodiments a material layer may for example be disposed between the lower electrode 260, and the first and second supporter patterns 220 and 240.

The first supporter pattern 220 and the second supporter pattern 240 may be disposed spaced apart from each other. Specifically, the first supporter pattern 220 and the second supporter pattern 240 may be disposed spaced apart from each other in a direction in which the lower electrode 260 extends (i.e., in a perpendicular direction to a plane on which the substrate 100 is disposed). For example, the first supporter pattern 220 may be disposed closer to the upper surface of the substrate 100 than the second supporter pattern 240.

A height from the substrate 100 to the upper surface of the lower electrode 260 may be substantially equal to a height from the substrate 100 to the upper surface of the second supporter pattern 240. That is, the uppermost portion of the lower electrode 260 and the upper surface of the second supporter pattern 240 may be formed at a same plane (i.e., coplanar). However, the inventive concept is not limited thereto. That is, in other embodiments the uppermost portion of the lower electrode 260 and the upper surface of the second supporter pattern 240 may be disposed at respective different heights from the upper surface of the substrate 100.

The capacitor dielectric film 270 may be conformally formed on the lower electrode 260, the first supporter pattern 220, the second supporter pattern 240, and the etch stop film 202. The capacitor dielectric film 270 may be formed on the entirety of an outer wall and an inner wall of the lower electrode 260. The capacitor dielectric film 270 may be formed of a single layer or a plurality of layers.

The capacitor dielectric film 270 may for example include at least one of silicon oxide ($SiO_2$), silicon nitride (SiN), and silicon oxynitride (SiON), and a high-k dielectric material. For example, although not limited thereto, the high-k dielectric material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Hereinbelow, a method for fabricating a semiconductor device according to example embodiments of the inventive concept will be described with reference to FIG. 1 to FIG. 17.

FIG. 3 to FIG. 17 illustrate views of intermediate stages of fabrication, provided as explanatory of a method for fabricating a semiconductor device according to example embodiments of the inventive concept.

Figure 3:
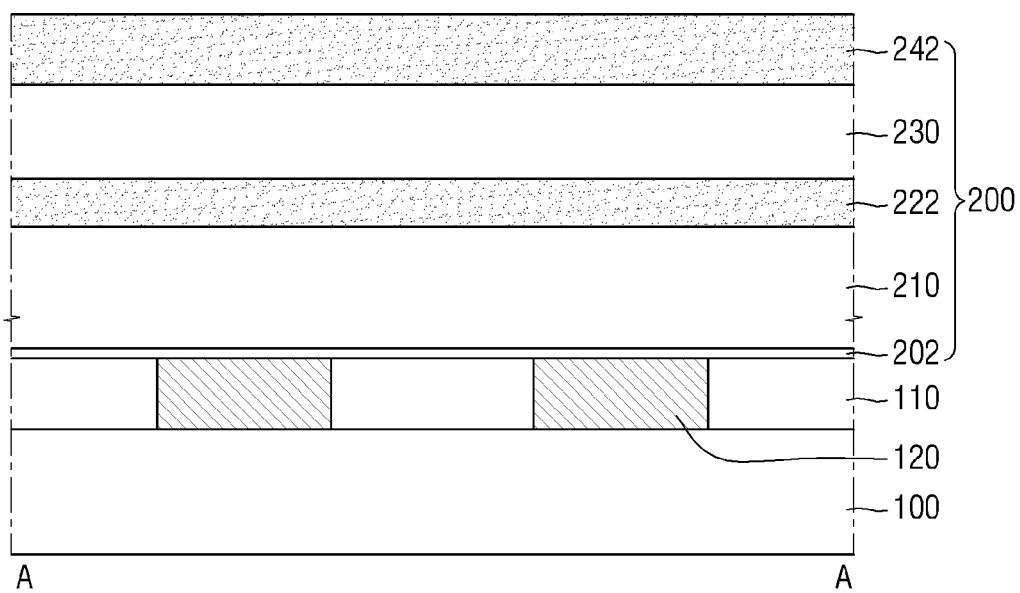
FIGS. 3, 4, 5, 6, 7, 8, 9, 10, 11, 12, 13, 14, 15, 16 and 17 illustrate views of intermediate stages of fabrication, explanatory of a method for fabricating a semiconductor device according to example embodiments of the inventive concept.

Referring to FIG. 3, an insulating layer 200 is formed over the substrate 100. The insulating layer 200 may be formed on interlayer insulating film 110 and contact plugs 120. The insulating layer 200 includes an etch stop film 202, a first mold film 210, a first supporter film 222, a second mold film 230, and a second supporter film 242 which are stacked over the substrate 100 in sequence.

The etch stop film 202 may include a material having an etch selectivity with respect to the first mold film 210 and the second mold film 230. The first mold film 210 and the second mold film 230 may include an oxide. The etch stop film 202 may for example be formed by using chemical vapor deposition (CVD). The etch stop film 202 may include, for example, silicon nitride (SiN), although the inventive concept is not limited thereto.

The first mold film 210 is formed on the etch stop film 202. The first mold film 210 may include silicon oxide. The first mold film 210 may for example include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP), plasma enhanced oxide (PEOX), flowable CVD (FCVD), or a combination thereof.

Although it is illustrated in FIG. 3 that the first mold film 210 is formed as a single layer, the inventive concept is not limited thereto. That is, in other embodiments, the first mold film 210 may include two or more layers having different etching speeds.

The first supporter film 222 is formed on the first mold film 210. As will be subsequently described, the first supporter film 222 is afterwards processed to form the first supporter pattern 220 shown in FIG. 2. The position of the first supporter film 222 may be adjusted as needed in consideration of the shape of a contact hole H (FIG. 13) subsequently formed and a change in etching time at which the contact hole H (FIG. 13) is formed.

The second mold film 230 is formed on the first supporter film 222. The second mold film 230 may include oxide. The second mold film 230 may include, for example, PE-TEOS or HDP-CVD oxide.

The second mold film 230 may be formed by using an oxide having an impurity concentration different from that of the first mold film 210. Accordingly, the first mold film 210 and the second mold film 230 may be etched at different etching speeds respectively. However, the inventive concept is not limited thereto. That is, in other embodiments, the second mold film 230 may include a same material as the first mold film 210.

The second supporter film 242 is formed on the second mold film 230. As will be subsequently described, the second supporter film 242 is afterwards processed to form the second supporter pattern 240 shown in FIG. 2.

Figure 4:
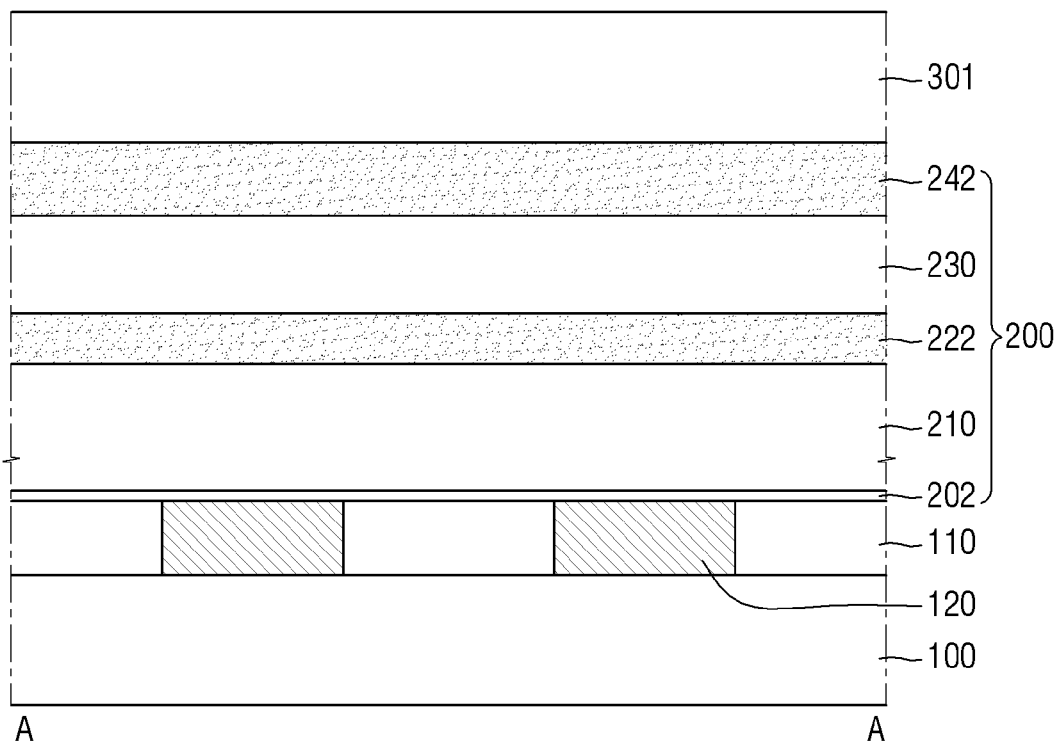

Referring to FIG. 4, a mask film 301 is formed on the insulating layer 200. The mask film 301 may be formed through a chemical vapor deposition (CVD) process or a diffusion process. The mask film 301 may for example include only silicon (Si), or may include doped silicon (Si). However, the inventive concept is not limited thereto, and the mask film 301 may include other suitable materials.

Figure 5:
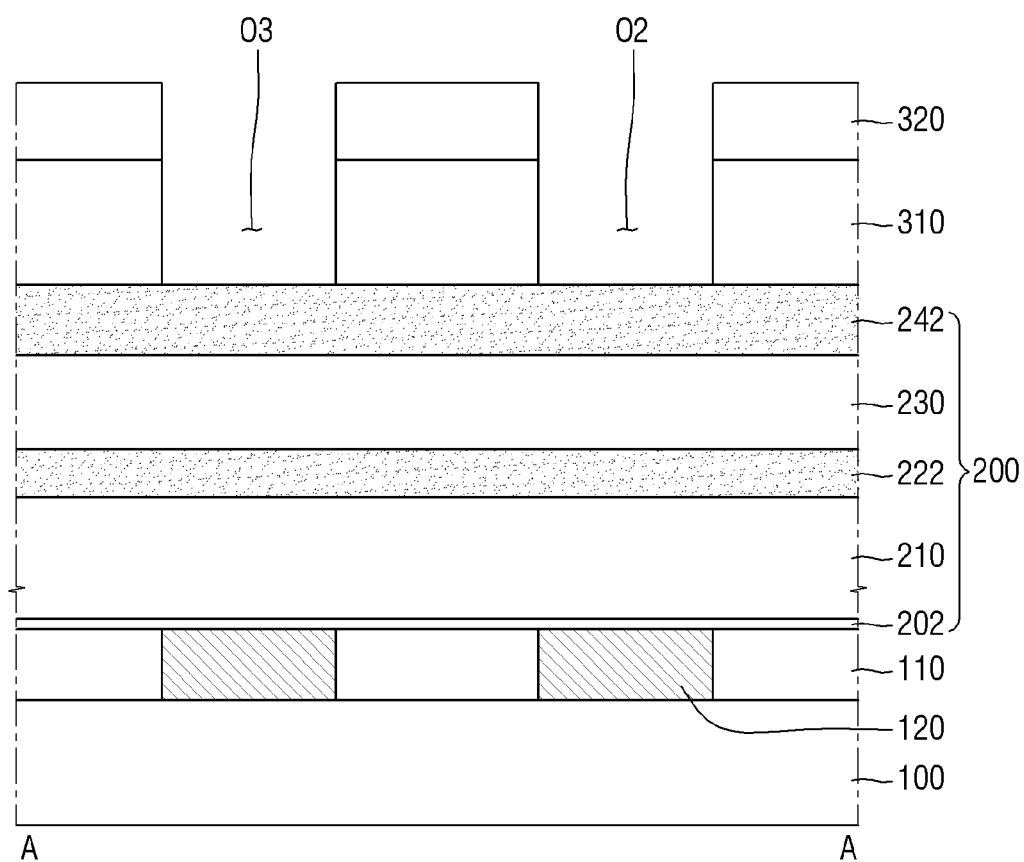

Referring to FIG. 5, a second mask pattern 320 is formed on the mask film 301 (see FIG. 4). Specifically, the second mask pattern 320 including a first opening O1 (see FIG. 1), a second opening O2 spaced apart from the first opening O1 in the first direction DR1 (see FIG. 1), and a third opening O3 spaced apart from the first opening O1 in the second direction DR2 (see FIG. 1) is formed on the mask film 301 (see FIG. 4).

The second mask pattern 320 may include, for example, an oxide. However, the inventive concept is not limited thereto, and the second mask pattern may include other suitable materials.

Subsequently, a first mask pattern 310 is formed by etching the mask film 301 (see FIG. 4) using the second mask pattern 320 as a mask.

Accordingly, a structure in which the first mask pattern 310 including silicon (Si) and the second mask pattern 320 including an oxide are stacked on the insulating layer 200 in sequence may be formed.

Figure 6:
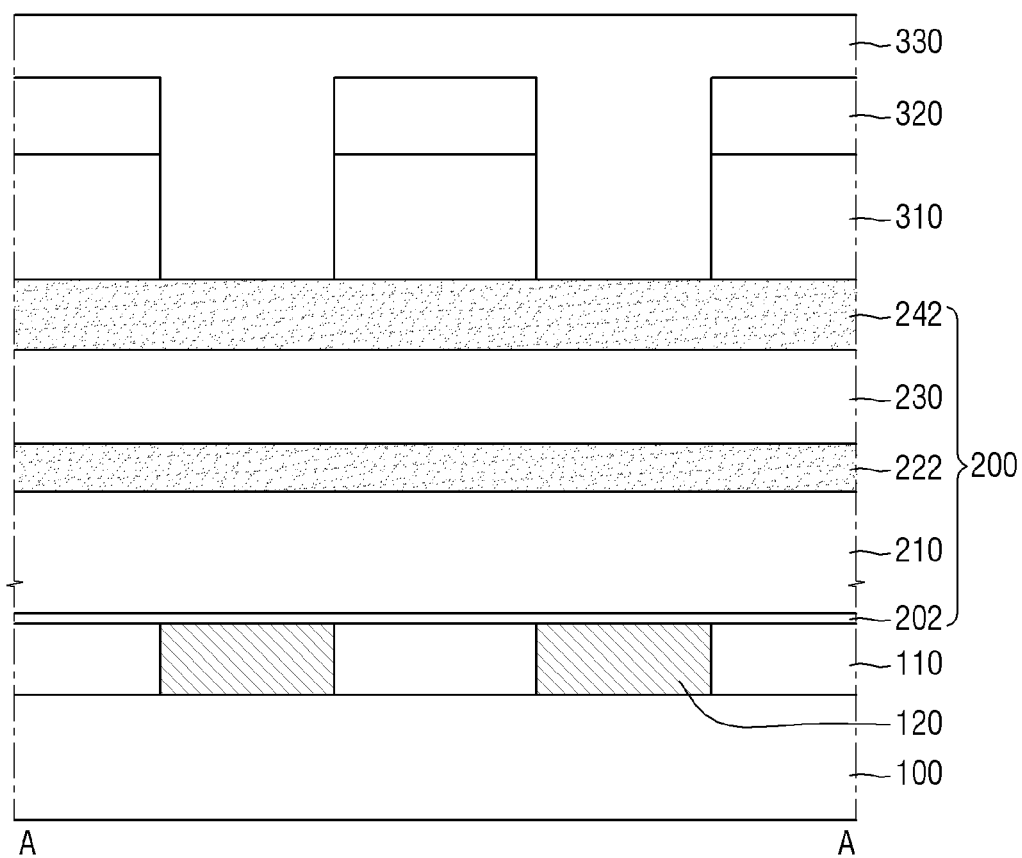

Referring to FIG. 6, a coating layer 330 is formed to cover the insulating layer 200, the first mask pattern 310, and the second mask pattern 320. Specifically, the coating layer 330 is formed to cover the upper surface of the second supporter film 242 exposed through the first to third openings O1, O2, and O3, the sidewalls of the first mask pattern 310 exposed in the first to third openings O1, O2, and O3, the upper surface of the second mask pattern 320, and the sidewalls of the second mask pattern 320 exposed in the first to third openings O1, O2, and O3.

In this case, the coating layer 330 may be formed through a spin on coating process. However, the inventive concept is not limited thereto, and the coating layer 330 may be formed using other suitable processes. The coating layer 330 may include carbon (C). In this case, the coating layer 330 may for example include only carbon (C), although the inventive concept is not limited thereto. In other embodiments, the coating layer 330 may include carbon combined with other materials.

Figure 7:
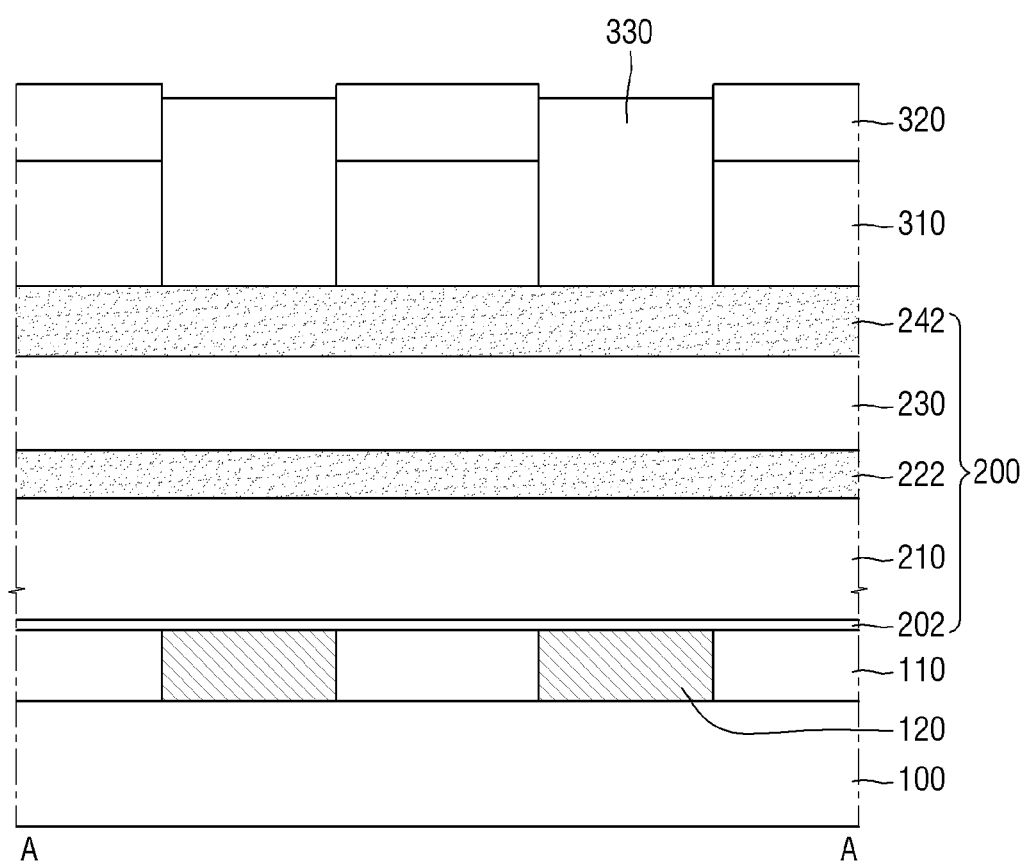

Referring to FIG. 7, a portion of the coating layer 330 is removed. Specifically, a portion of the coating layer 330 is removed through an etch back process so that the upper surface of the second mask pattern 320 is exposed. The coating layer 330 as shown formed in the openings in FIG. 7 may for example be characterized respectively as the remaining parts of the coating layer 330 after the removing of the portion of the coating layer 330.

In this case, portions of upper sidewalls of the second mask pattern 320 may also be exposed as shown in FIG. 7. However, the inventive concept is not limited thereto. That is, in other embodiments upper surfaces of the remaining parts of the coating layer 330 after removal of the portion of the coating layer 330 and the upper surface of the second mask pattern 320 may be formed on a same plane (i.e., may be coplanar).

Figure 8:
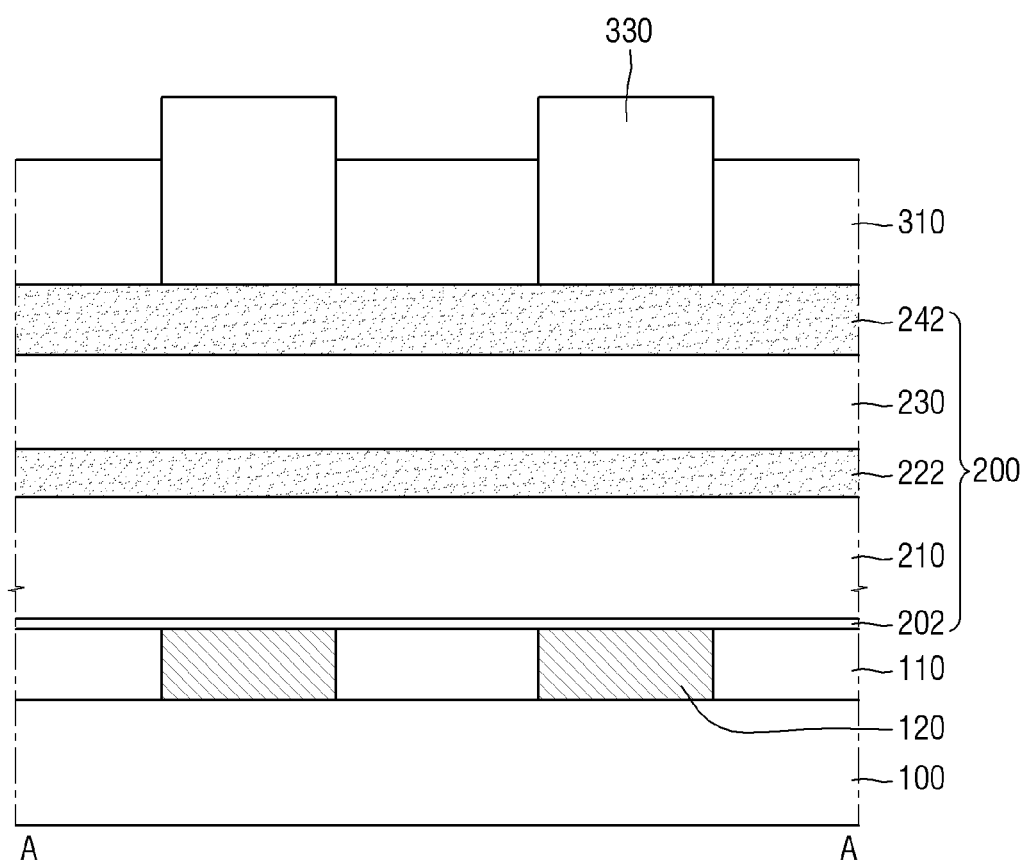

Referring to FIG. 8, the upper surface of the first mask pattern 310 is exposed by removing the second mask pattern 320. For example, the second mask pattern 320 including an oxide may be selectively removed through wet etching using HF. However, the inventive concept is not limited thereto, and the second mask pattern 320 may be removed by other suitable processes.

Figure 9:
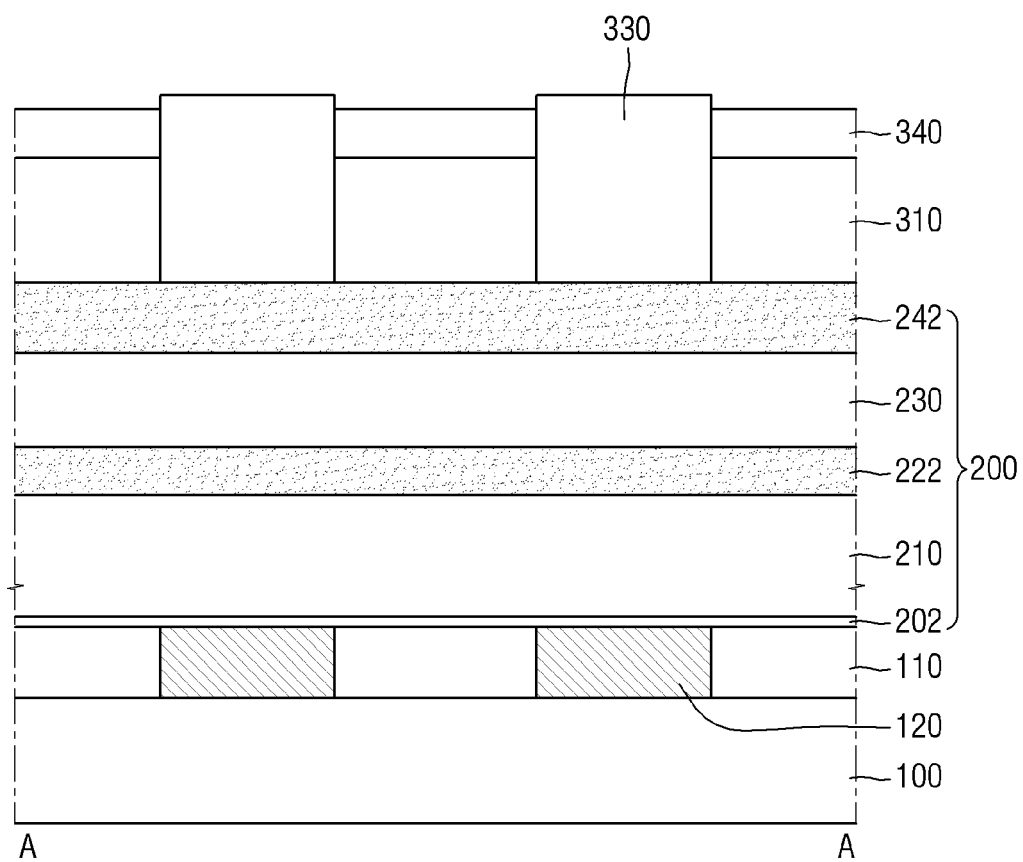

Referring to FIG. 9, a metal layer 340 is formed on the first mask pattern 310. Specifically, the metal layer 340 is formed on the upper surface of the first mask pattern 310 and on portions of the sidewalls of the remaining parts of the coating layer 330 that remain after the removal of the portion of the coating layer 330 as described with respect to FIG. 7. That is, the upper surface of the metal layer 340 may be formed closer to the substrate 100 than the upper surface of the remaining parts of the coating layer 330. In other words, the upper surface of the remaining parts of the coating layer 330 are above the upper surface of the metal layer 340. However, the inventive concept is not limited thereto. That is, in other embodiments, the upper surface of the metal layer 340 may be formed on the same plane as the upper surface of the remaining parts of the coating layer 330 (i.e., may be coplanar).

The metal layer 340 may be formed by selectively depositing a metal on the first mask pattern 310. For example, the metal layer 340 may be formed on the first mask pattern 310 through a chemical vapor deposition (CVD) process or an electroless deposition process. However, the inventive concept is not limited thereto. That is, in other embodiments, the metal layer 340 may be formed by depositing the metal to cover the first mask pattern 310 and the remaining parts of the coating layer 330, and then etching a portion of the metal to expose the remaining parts of the coating layer 330.

The metal layer 340 may for example include at least one of tungsten (W), tungsten nitride (WN), tungsten carbide (WC), aluminium (Al), aluminium oxide ($Al_2O_3$), titanium (Ti), titanium oxide (TiO), tantalum (Ta), tantalum oxide (TaO), and tungsten silicon (WSi). However, the inventive concept is not limited thereto, and the metal layer may be include other suitable materials.

Figure 10:
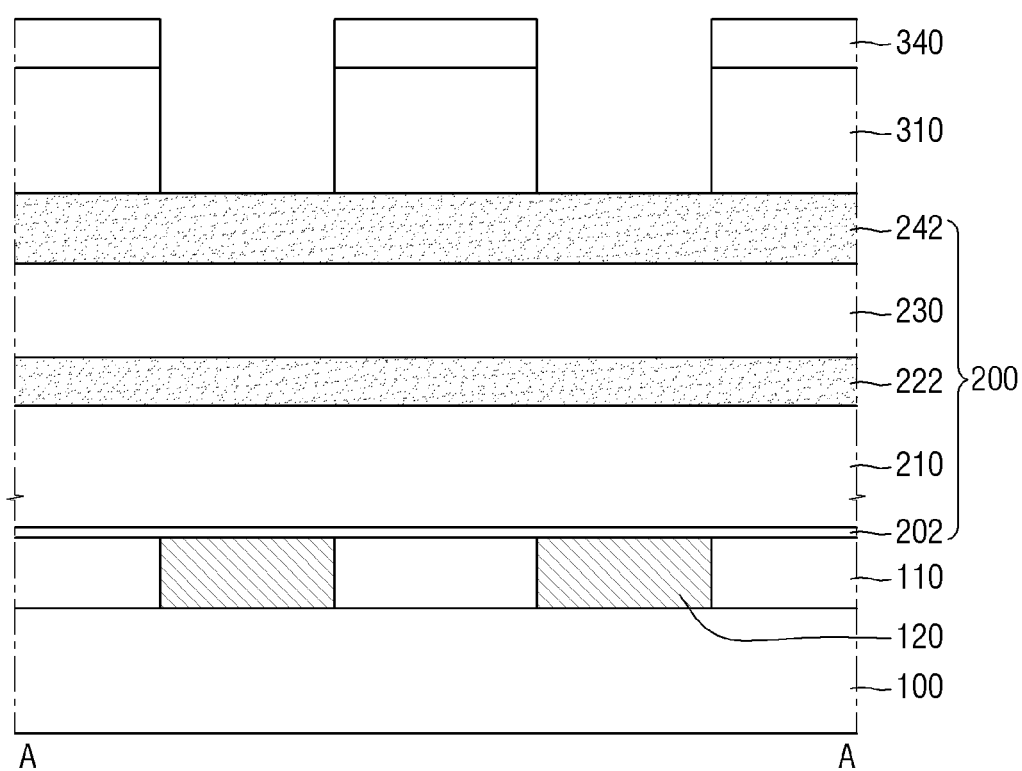

Referring to FIG. 10, an upper surface of the insulating layer 200, that is portions of the upper surface of the second supporter film 242 within the first, second and third openings O1, O2 and O3 (see FIG. 1), are exposed by removing the remaining parts of the coating layer 330. For example, the remaining parts of the coating layer 330 formed of carbon (C) may be removed by being oxidizing through an ashing process using oxygen (O). However, the inventive concept is not limited thereto, and the remaining parts of the coating layer 330 may be removed using other suitable processes.

Figure 11:
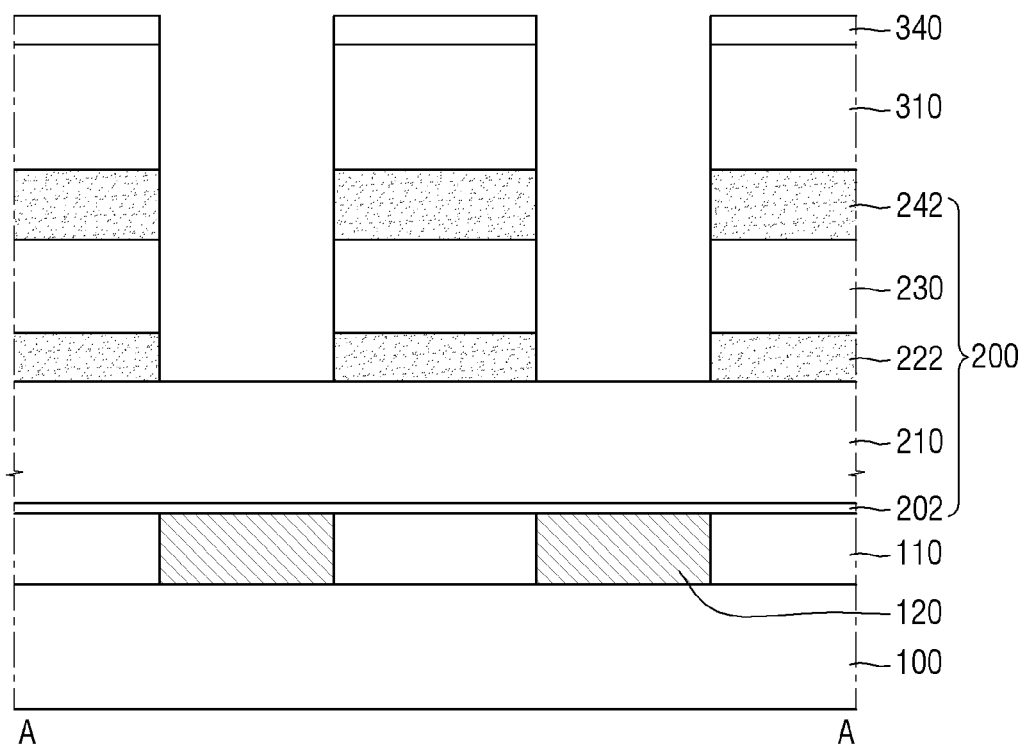
Figure 12:
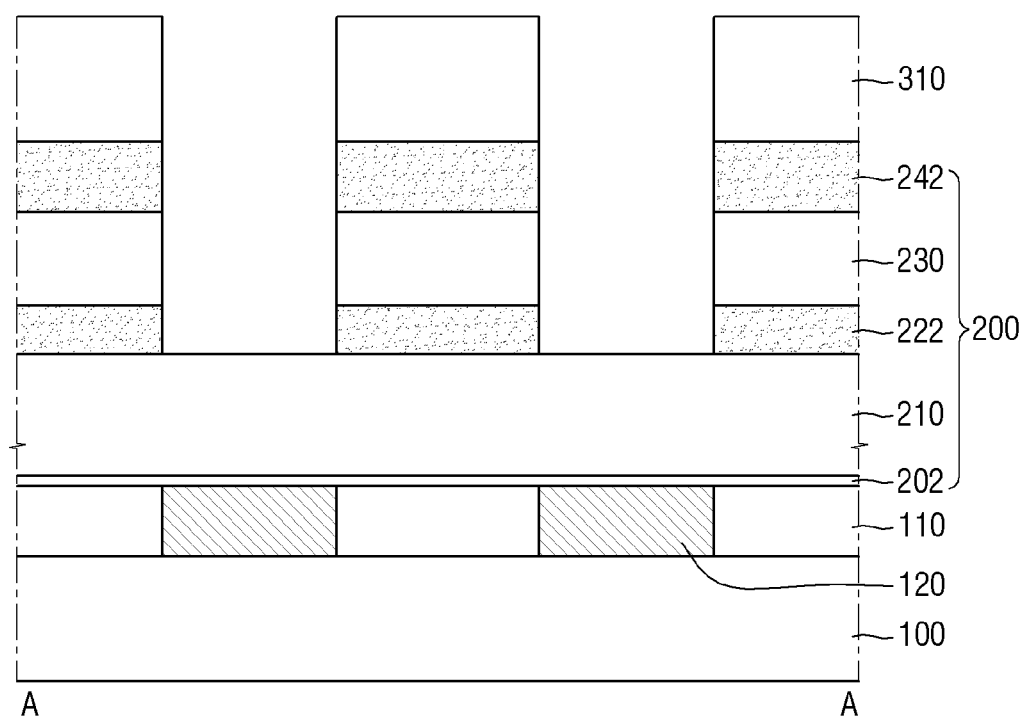
Figure 13:
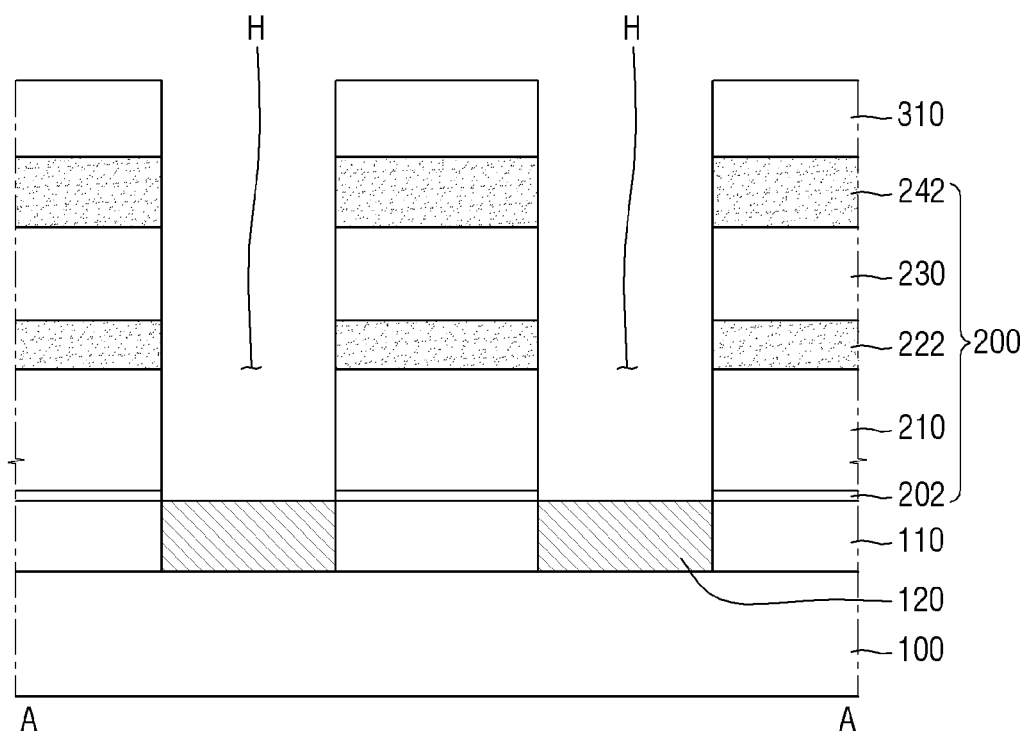

Referring to FIG. 11, FIG. 12 and FIG. 13, the contact holes H (e.g., see FIGS. 1 and 13) are formed in the insulating layer 200 by etching the insulating layer 200 using the first mask pattern 310 and the metal layer 340 as a mask.

Referring to FIG. 11, a portion of the insulating layer 200 are etched using the first mask pattern 310 and the metal layer 340 as a mask. Specifically, the second supporter film 242, the second mold film 230, and the first supporter film 222 are etched using the first mask pattern 310 and the metal layer 340 as a mask.

While the second supporter film 242, the second mold film 230, and the first supporter film 222 are being etched in sequence, a portion of the metal layer 340 may be etched and thus a thickness of the metal layer 340 may be reduced.

Referring to FIG. 12, the upper surface of the first mask pattern 310 is exposed by removing the metal layer 340. In this case, for example, the metal layer 340 may be removed by wet etching using an etchant in which sulfuric acid ($H_2SO_4$) and hydrochloric acid (HCl) of high temperature are mixed. However, the inventive concept is not limited thereto, and the metal layer 340 may be removed using other suitable processes.

Referring to FIG. 13, an other portion of the insulating layer 200 are etched using the first mask pattern 310 as a mask. Specifically, the first mold film 210 and the etch stop film 202 are etched using the first mask pattern 310 as a mask. While the first mold film 210 is being etched, a portion of the first mask pattern 310 may be etched and thus a thickness of the first mask pattern 310 may be reduced.

Accordingly, the contact holes H may be formed in the insulating layer 200 through the processes described with respect to FIGS. 11, 12 and 13.

Figure 14:
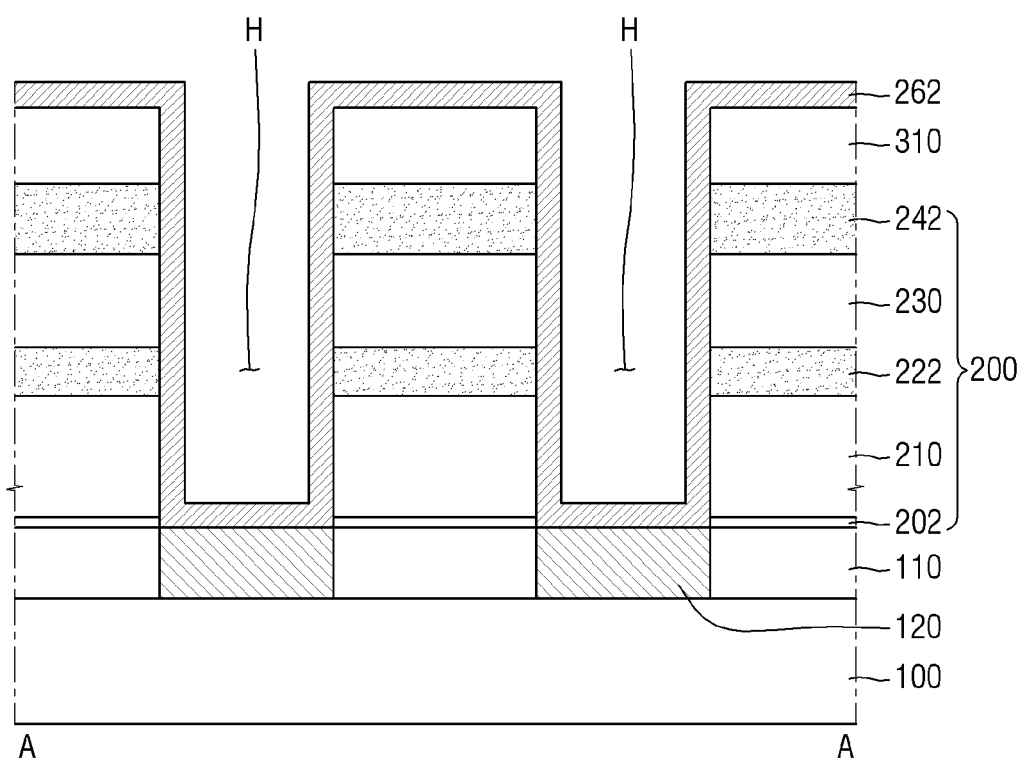

Referring to FIG. 14, a lower electrode film 262 is formed on the upper surface of the contact plugs 120 exposed by the contact holes H, on the inner walls of the contact holes H, and on the sidewalls and the upper surface of the first mask pattern 310. In this case, the lower electrode film 262 may be conformally formed, although the inventive concept is not limited thereto.

The lower electrode film 262 may be a conductive material, and may for example include at least one selected from doped poly silicon, conductive metal nitride (e.g., titanium nitride, tantalum nitride, tungsten nitride, or the like), metal (e.g., ruthenium, iridium, titanium, tantalum, or the like), and conductive metal oxide (e.g., iridium oxide, or the like).

Figure 15:
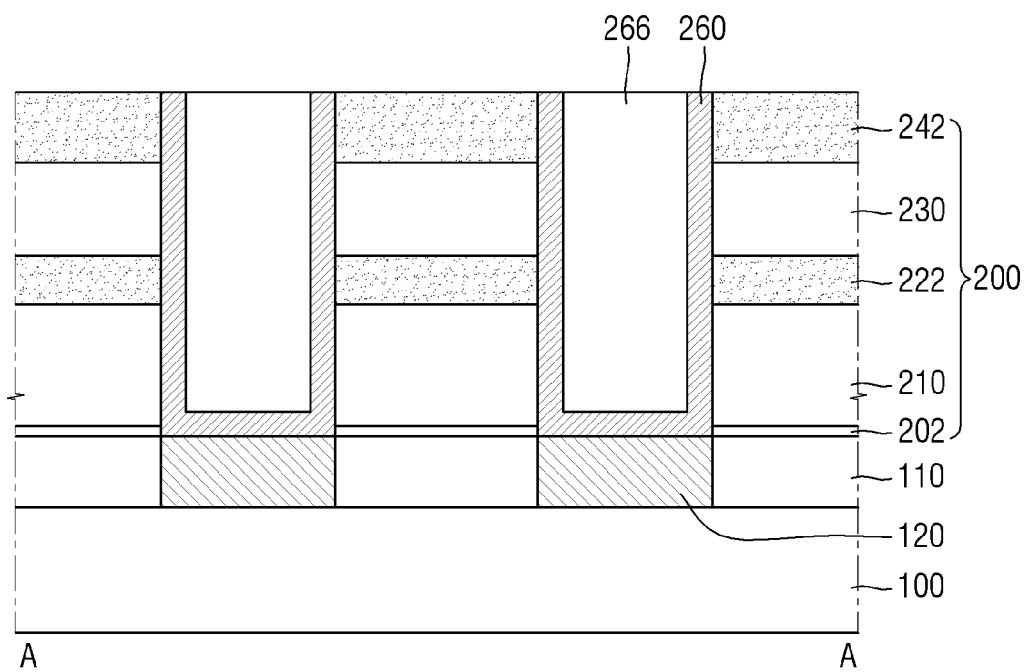

Referring to FIG. 15, a sacrificial film 266 is formed on the lower electrode film 262 to fill the contact holes H. The sacrificial film 266 may include a material having good gap filling capability, and may for example include an oxide such as undoped silica glass (USG), spin on glass (SOG), or the like. The sacrificial film 266 may perform a function of protecting the lower electrodes 260 during a polishing process and an etching process which are performed to complete the lower electrodes 260 in a subsequent process.

Subsequently, the lower electrode film 262, the first mask pattern 310, and a portion of the sacrificial film 266 are removed using a process including at least one of a chemical mechanical polishing (CMP) process and an etch back process, until the upper surface of the second supporter film 242 is exposed.

Accordingly, the lower electrodes 260 electrically connected with the contact plugs 120 are formed in the contact holes H, and the respective lower electrodes 260 may be electrically disconnected (i.e., isolated) from one another. The sacrificial film 266 may fill the inside of the contact holes H in which the lower electrode 260 are formed.

Figure 16:
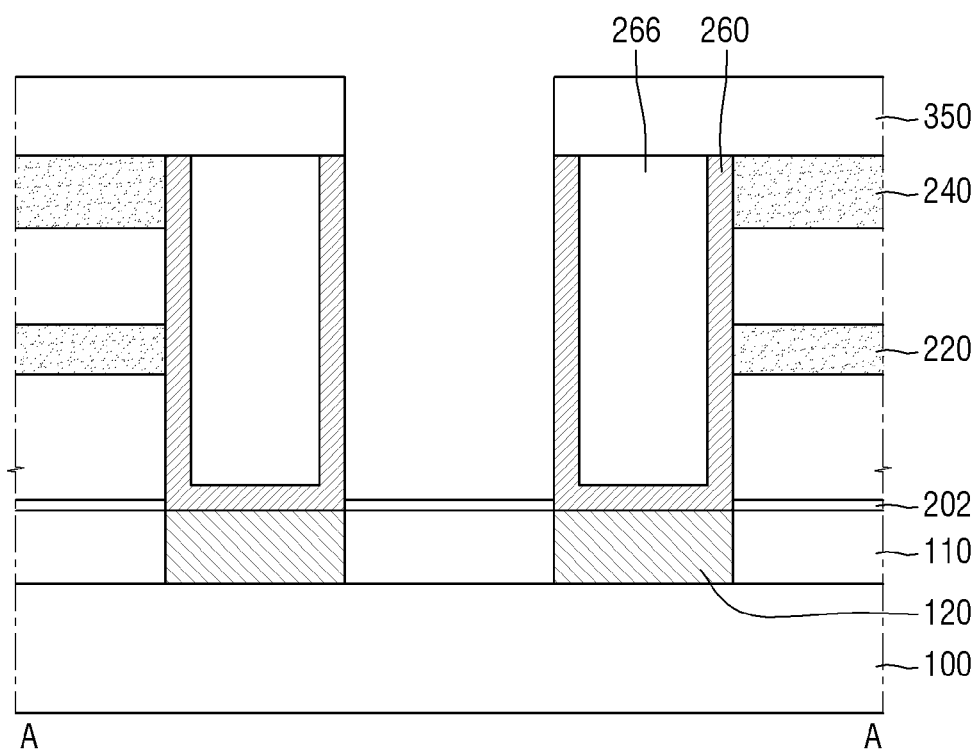

Referring to FIG. 16, a third mask pattern 350 is formed on the lower electrodes 260, on the sacrificial film 266, and on portions of the second supporter film 242 (see FIG. 15).

Specifically, the third mask pattern 350 is formed on a portion of the second supporter film 242 other than a portion of supporter film 242 overlapping or corresponding to a region between the adjacent lower electrodes 260. That is, the third mask pattern 350 is not formed on a portion of second supporter film 242 that overlaps or corresponds to the open region R1 illustrated in FIG. 1. In this case, the open region R1 (see FIG. 1) may be defined by the third mask pattern 350.

Subsequently, the second supporter pattern 240 is formed by etching the second supporter film 242 (see FIG. 15) using the third mask pattern 350 as a mask. The second supporter film 242 may be etched by using an etch process, such as for example a dry etch process.

Subsequently, the second mold film 230 (see FIG. 15) is etched by using an etch process, such as for example a wet etch process, through a trench formed by etching the second supporter film 242 (see FIG. 15).

In this case, the second mold film 230 formed between the first supporter film 222 and the second supporter pattern 240 is also etched. That is, the second mold film 230 outside the open region R1 (see FIG. 1) is also etched.

Subsequently, the first supporter pattern 220 is formed by etching the first supporter film 222 (see FIG. 15) using the third mask pattern 350 as a mask. The first supporter film 222 may be etched by using an etch process such as for example a dry etch process.

Subsequently, the first mold film 210 (see FIG. 15) is etched by using an etch process, such as for example a wet etch process, through a trench formed by etching the first supporter film 222 (see FIG. 15).

In this case, the first mold film 210 formed between the etch stop film 202 and the first supporter pattern 220 is also etched. That is, the first mold film 210 outside the open region R1 (see FIG. 1) is also etched.

Through the above-described processes, the open region R1 (see FIG. 1) exposing portions of the sidewalls of each of the plurality of lower electrodes 260 may be formed by etching the insulating layer 200 (see FIG. 15) formed between the plurality of contact holes H.

Although it is described that a portion of the first supporter film 222 and a portion of the second supporter film 242 (see FIG. 15) are removed through dry etch processes, the inventive concept is not limited thereto. That is, the portion of the first supporter film 222 and the portion of the second supporter film 242 may be removed by other suitable processes. In addition, although it is described that the first mold film 210 and the second mold film 230 (see FIG. 15) are removed through wet etch processes, the inventive concept is not limited thereto. That is, the first mold film 210 and the second mold film 230 may be removed by other suitable processes.

Figure 17:
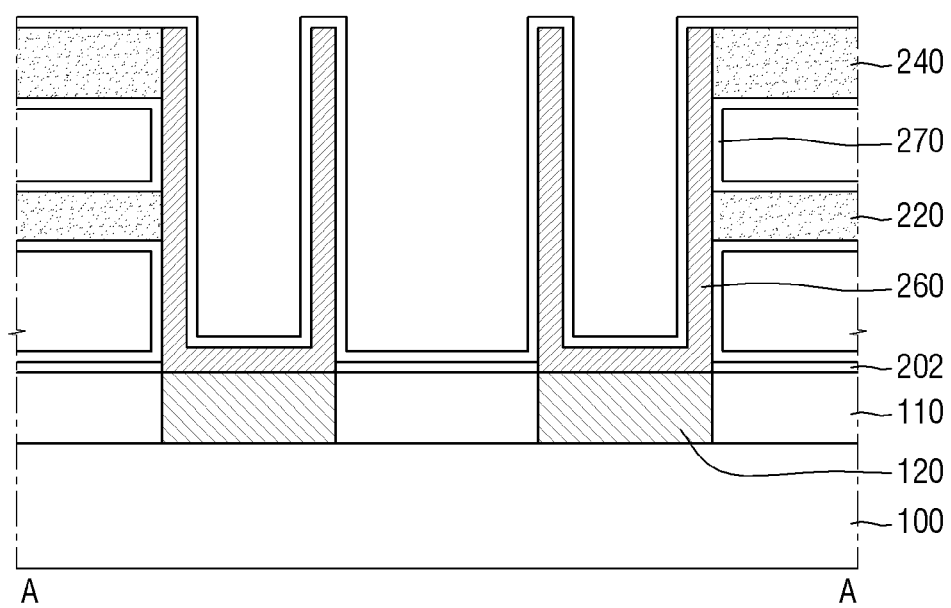

Referring to FIG. 17, after the third mask pattern 350 and the sacrificial film 266 (see FIG. 16) are removed, the capacitor dielectric film 270 is formed on the outer walls of the lower electrodes 260, the inner walls of the lower electrodes 260, the first supporter pattern 220, the second supporter pattern 240, and the etch stop film 202. In this case, the capacitor dielectric film 270 is conformally formed, although the inventive concept is not limited thereto.

Referring to FIG. 2, the upper electrode 280 is formed on the capacitor dielectric film 270. Specifically, the upper electrode 280 is formed on the capacitor dielectric film 270 between the lower electrodes 260 formed in each structure having a cylindrical shape, on the capacitor dielectric film 270 between different lower electrodes 260 adjacent to each other, on the capacitor dielectric film 270 between the first supporter pattern 220 and the second supporter pattern 240, and on the capacitor dielectric film 270 between the first supporter pattern 220 and the etch stop film 202. Through the above-described process, the semiconductor device illustrated in FIG. 2 may be fabricated.

The upper electrode 280 may include for example at least one of doped poly silicon, metal, conductive metal nitride, and metal silicide, or the like.

The method for fabricating the semiconductor device according to embodiments of the inventive concept can enhance productivity by effectively etching an insulating layer in a structure having a high aspect ratio by using a hybrid mask pattern including a silicon mask pattern and a metal layer. That is, according to embodiments of the inventive concept as described with respect to FIGS. 1-17, insulating layer 200 is etched using a hybrid mask pattern including the first mask pattern 310 (including Si) and the metal layer 340.

Although the method for fabricating the semiconductor device according to example embodiments of the inventive concept is illustrated and described as an example of a fabricating method of a DRAM, the inventive concept is not limited thereto.

That is, in other example embodiments, a channel hole may be formed in a fabrication process of a vertical NAND, by using the hybrid mask formed of the silicon mask pattern and the metal layer in the method for fabricating the semiconductor device of the inventive concept.

In addition, in some other example embodiments, a contact hole may be formed by etching an insulating layer formed between gate electrodes, by using the hybrid mask formed of the silicon mask pattern and the metal layer in the method for fabricating the semiconductor device of the inventive concept.

Hereinafter, a method for fabricating a semiconductor device according to other example embodiments of the inventive concept will be described with reference to FIG. 18 and FIG. 19. The following description with reference to FIGS. 18 and 19 will focus mainly on differences with respect to the method for fabricating the semiconductor device described with reference to FIG. 3 to FIG. 17, and repetitive description may be omitted.

Figure 18:
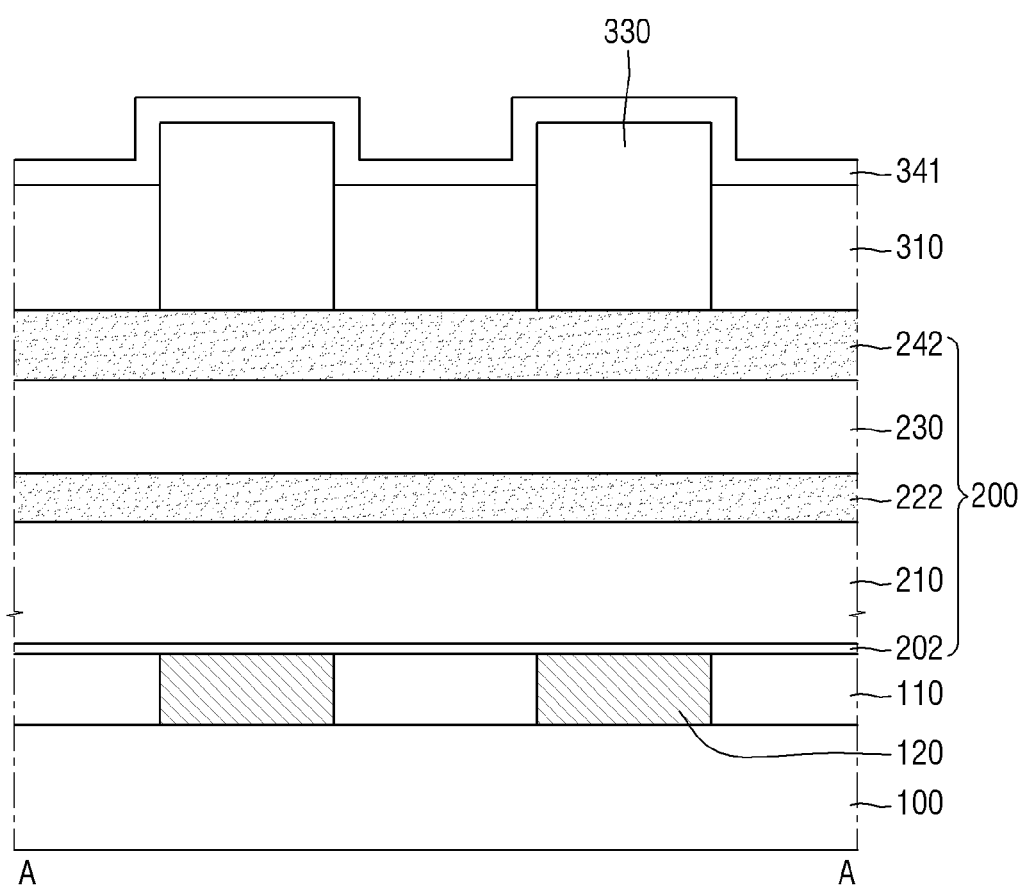
FIG. 18 and FIG. 19 illustrate views of intermediate stages of fabrication, explanatory of a method for fabricating a semiconductor device according to other example embodiments of the inventive concept.
Figure 19:
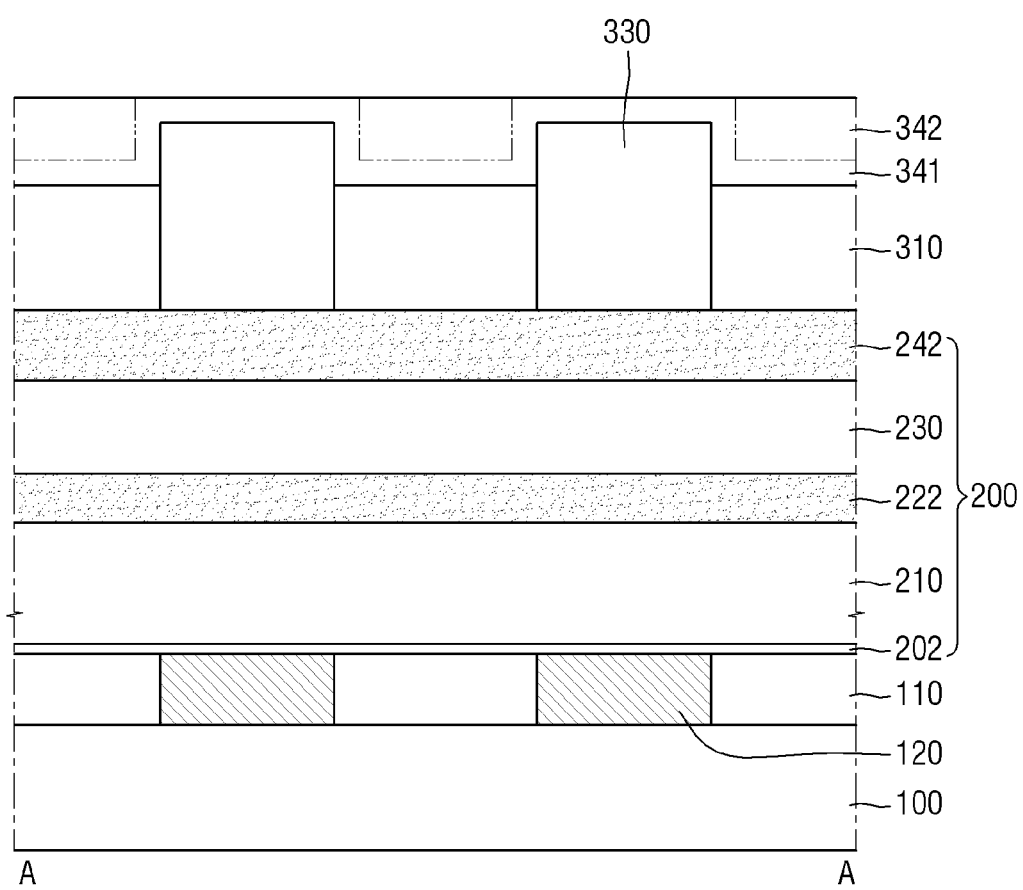

FIG. 18 and FIG. 19 illustrate views of intermediate stages of fabrication, explanatory of a method for fabricating a semiconductor device according to some other example embodiments of the inventive concept.

Referring to FIG. 18, after the fabricating process of the semiconductor device illustrated in FIG. 3 to FIG. 8 is performed, a first metal layer 341 is formed to completely cover the first mask pattern 310 and the remaining parts of the coating layer 330. Specifically, the first metal layer 341 is conformally deposited on the upper surface of the first mask pattern 310 and the exposed sidewalls and upper surfaces of the remaining parts of the coating layer 330.

Referring to FIG. 19, a second metal layer 342 is formed on the first metal layer 341. Specifically, the first metal layer 341 is conformally deposited such that the second metal layer 342 is deposited in voids formed between the respective remaining parts of the coating layers 330.

Although it is illustrated in FIG. 19 that the second metal layer 342 is deposited only on the first metal layer 341 between the respective remaining parts of the coating layers 330, in other embodiments of the inventive concept, the second metal layer 342 may be deposited not only on the first metal layer 341 between the respective remaining parts of the coating layers 330, but also on the first metal layer 341 over the upper surfaces of the respective remaining parts of the coating layers 330.

The second metal layer 342 may include the same metal as the first metal layer 341. However, the inventive concept is not limited thereto. That is, the first metal layer 341 may include metal different than the metal of the second metal layer 342.

The first metal layer 341 and the second metal layer 342 may include a same material as the metal layer 340 illustrated in FIG. 9. However, the inventive concept is not limited thereto.

Subsequently, the upper surface and a portion of the sidewalls of the remaining parts of the coating layer 330 are exposed by etching the first metal layer 341 and a portion of the second metal layer 342. Through the above-described process, the metal layer 340 may be formed on the first mask pattern 310 as illustrated in FIG. 9.

Hereinbelow, a method for fabricating a semiconductor device according to some other exemplary embodiments of the present disclosure will be described with reference to FIG. 20 and FIG. 21. Differences from the method for fabricating the semiconductor device illustrated in FIG. 3 to FIG. 17 will be mainly described.

Figure 20:
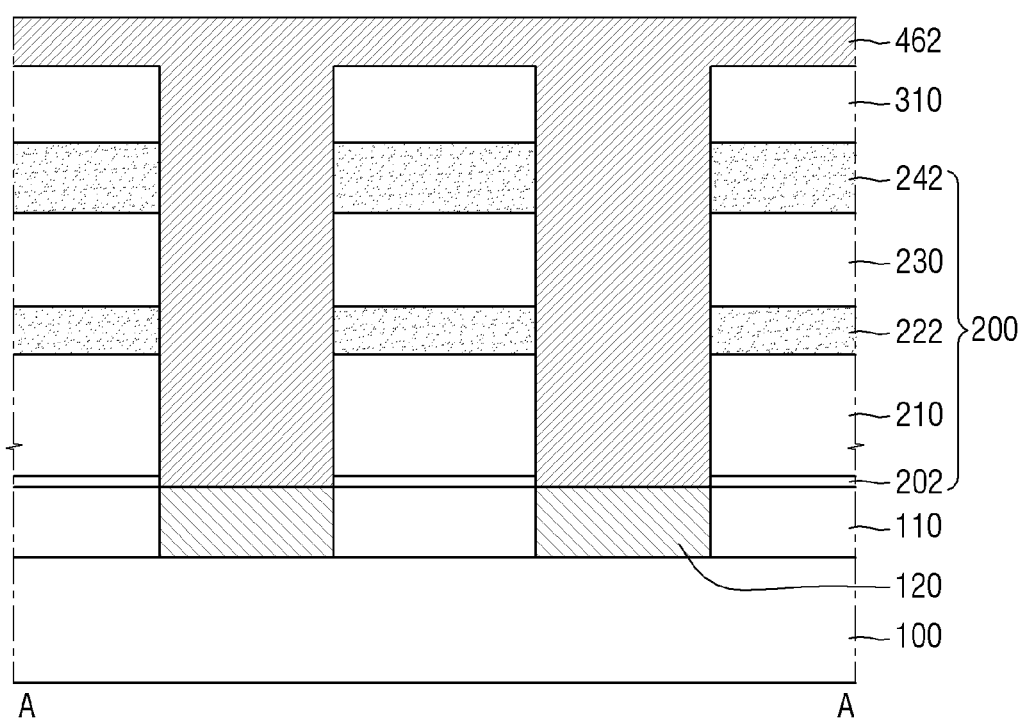
FIG. 20 and FIG. 21 illustrate views of intermediate stages of fabrication, explanatory of a method for fabricating a semiconductor device according to other example embodiments of the inventive concept.
Figure 21:
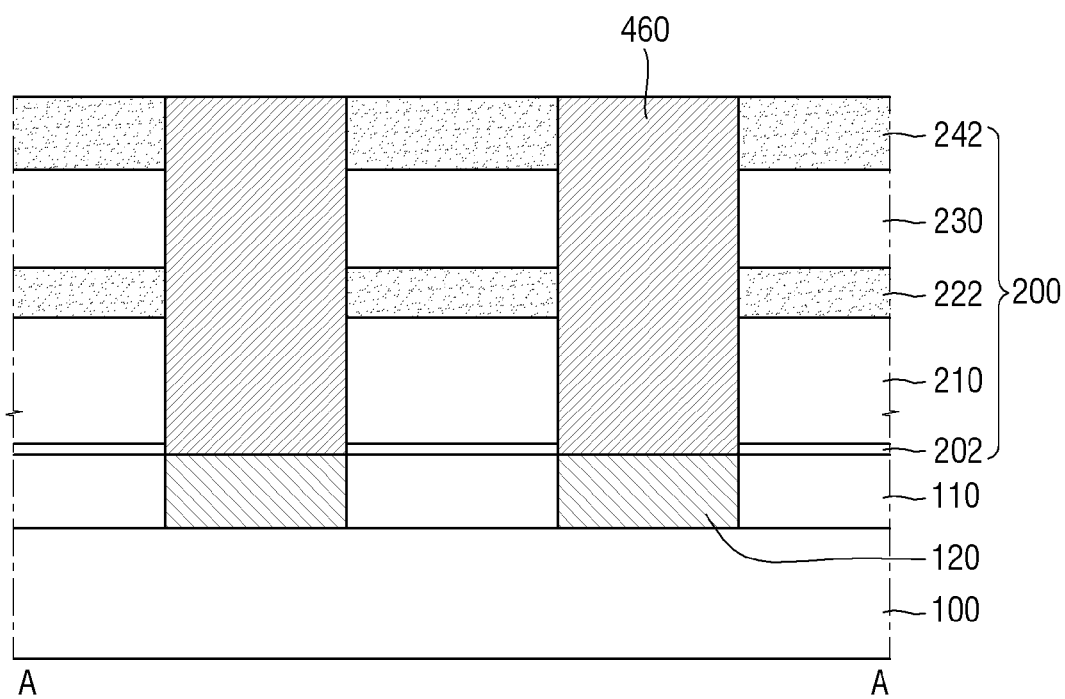

FIG. 20 and FIG. 21 illustrate views of intermediate stages of fabrication, explanatory of a method for fabricating a semiconductor device according to some other example embodiments of the inventive concept. The following description with reference to FIGS. 20 and 21 will focus mainly on differences with respect to the method for fabricating the semiconductor device described with reference to FIG. 3 to FIG. 17, and repetitive description may be omitted.

Referring to FIG. 20, after the fabricating process of the semiconductor device illustrated in FIG. 3 to FIG. 13 is performed, a lower electrode film 462 is formed to completely fill the inside of the contact holes H (see FIG. 13) formed in the insulating layer 200. In this case, the lower electrode film 462 is formed on the sidewalls and the upper surface of the first mask pattern 310.

Referring to FIG. 21, the lower electrode film 462 and the first mask pattern 310 are removed using a process including at least one of a chemical mechanical polishing (CMP) process and an etch back process, until the upper surface of the second supporter film 242 is exposed.

Accordingly, a lower electrodes 460 electrically connected with the contact plugs 120 may be formed in the contact holes H (see FIG. 13), and the respective lower electrodes 460 may be electrically disconnected (i.e., isolated) from one another.

Through the above-described process, lower electrodes 460 having a pillar shape may be formed.

Figure 22:
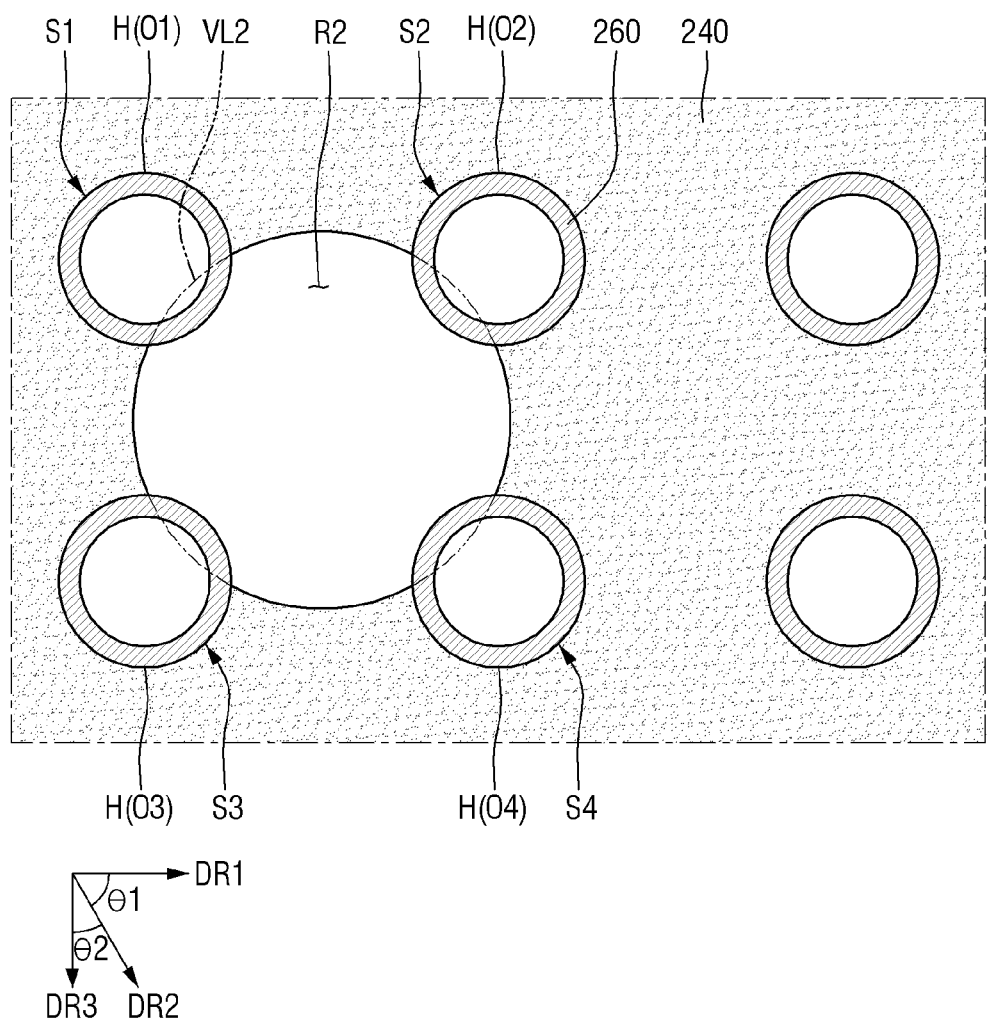
FIG. 22 illustrates a top planar view of a semiconductor device fabricated according to a fabricating method of a semiconductor device according to other example embodiments of the inventive concept.

Hereinbelow, a method for fabricating a semiconductor device according to some other example embodiments of the inventive concept will be described with reference to FIG. 5 and FIG. 22. The following description with reference to FIGS. 5 and 22 will focus mainly on differences with respect to the method for fabricating the semiconductor device described with reference to FIGS. 1 and 3-17, and repetitive description may be omitted. FIG. 22 illustrates a top planar view of a semiconductor device fabricated according to a fabricating method of a semiconductor device according to some other example embodiments of the inventive concept.

Referring to FIG. 22, respective structures of the semiconductor device fabricated according to the fabricating method of the semiconductor device according to some other example embodiments of the inventive concept are arranged at the vertexes of a rectangular shape.

Specifically, the semiconductor device includes a first structure S1, a second structure S2 spaced apart from the first structure S1 along a first direction DR1, a third structure S3 spaced apart from the first structure S1 along a third direction DR3, and a fourth structure S4 spaced apart from the third structure S3 along the first direction DR1.

An angle ($\theta 1+\theta 2$) formed between the first direction DR1 and the third direction DR3 may be 90 degrees. Sidewalls of an open region R2 of the respective first supporter patterns 220 and second supporter patterns 240 are formed along a second virtual line VL2 of a circular shape.

Referring to FIG. 5 and FIG. 22, the semiconductor device illustrated in FIG. 22 may be fabricated by forming, on the second supporter film 242, the first mask pattern 310 including a first opening O1, a second opening O2 spaced apart from the first opening O1 along the first direction DR1, a third opening O3 spaced apart from the first opening O1 along the third direction DR3, and a fourth opening O4 spaced apart from the third opening O3 along the first direction DR1, and then performing subsequent processes as described with reference to FIGS. 6-17.

Hereinafter, a method for fabricating a semiconductor device according to some other example embodiments of the inventive concept will be described with reference to FIG. 16 and FIG. 23. The following description with reference to FIGS. 16 and 23 will focus mainly on differences with respect to the method for fabricating the semiconductor device described with reference to FIGS. 1 and 3-17, and repetitive description may be omitted.

Figure 23:
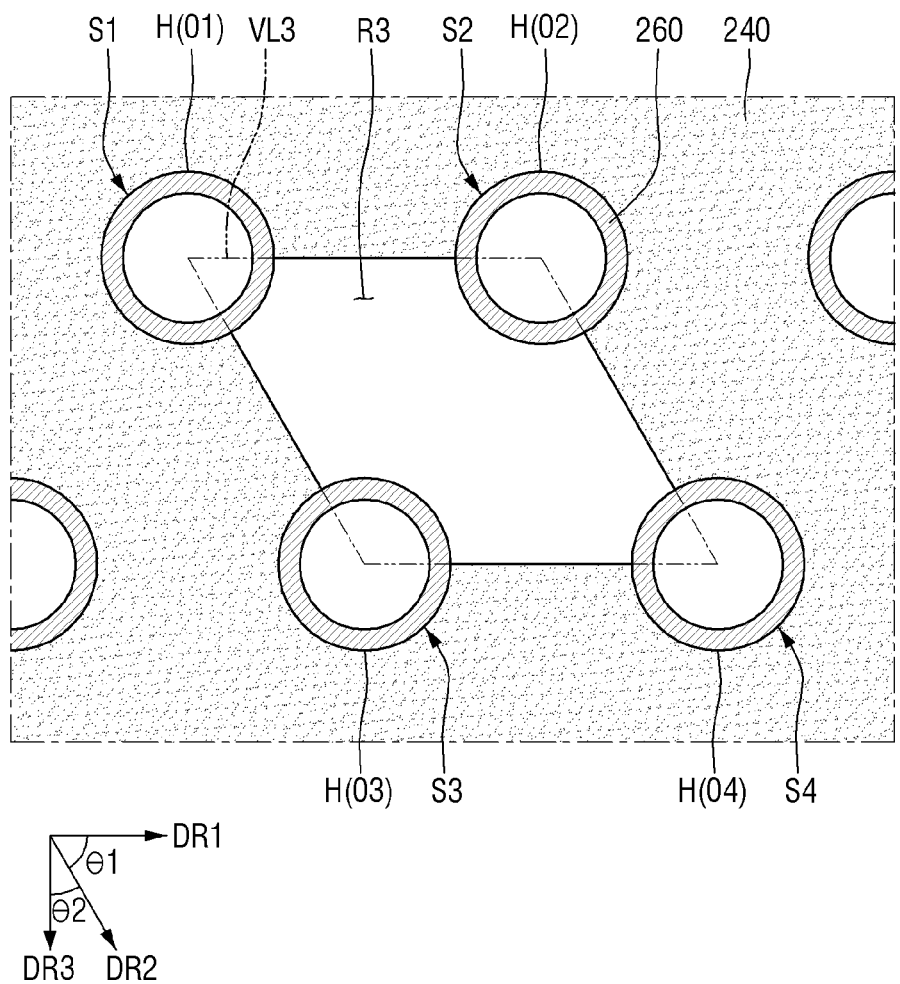
FIG. 23 illustrates a top planar view of a semiconductor device fabricated according to a fabricating method of a semiconductor device according to other example embodiments of the inventive concept.

FIG. 23 illustrates a top planar view of a semiconductor device fabricated according to a fabricating method of a semiconductor device according to some other example embodiments of the inventive concept.

Referring to FIG. 23, the semiconductor device fabricated according to the fabricating method of the semiconductor device according to some other example embodiments of the inventive concept includes a first structure S1, a second structure S2 spaced apart from the first structure S1 along a first direction DR1, a third structure S3 spaced apart from the first structure S1 along a second direction DR2, and a fourth structure S4 spaced apart from the third structure S3 along the first direction DR1.

Sidewalls of an open region R3 of the respective first supporter patterns 220 and second supporter patterns 240 are formed along a third virtual line VL3 having the shape of a parallelogram.

Referring to FIG. 16 and FIG. 23, the semiconductor device illustrated in FIG. 23 may be fabricated by forming the third mask pattern 350 to have an opening corresponding to the open region R3 when the insulating layer 200 (see FIG. 15) is etched by using the third mask pattern 350 to form the open region R3, and then performing subsequent process.

Figure 24:
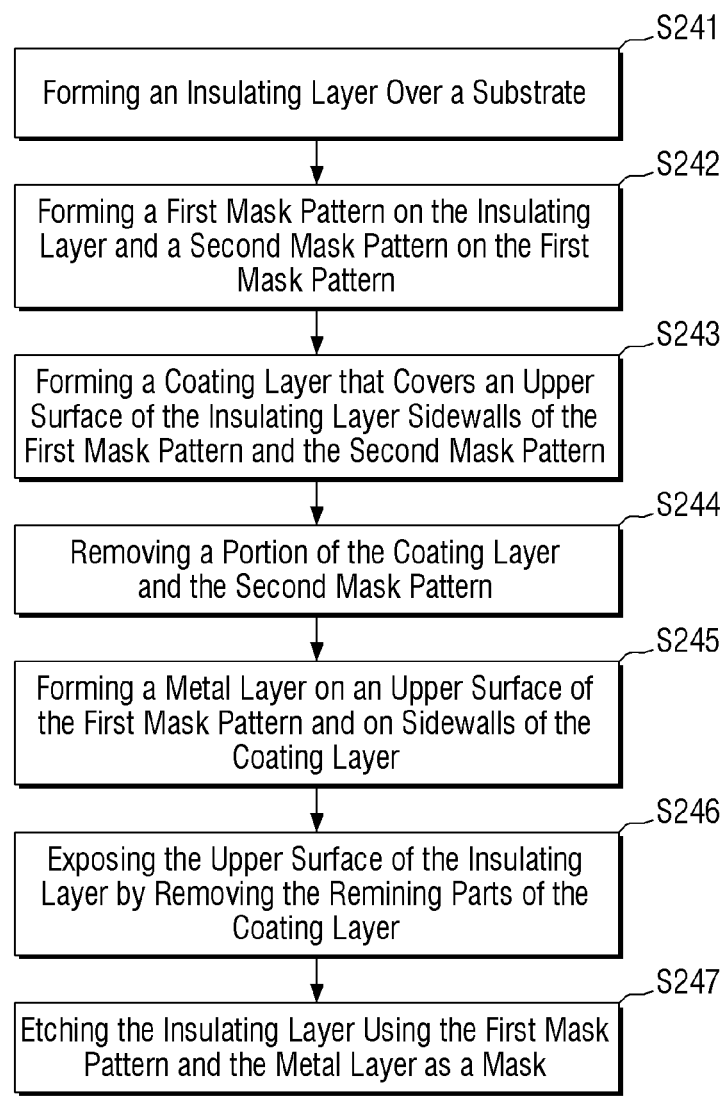
FIG. 24 illustrates a flowchart explanatory of a method of fabricating a semiconductor device according to example embodiments of the inventive concept.

FIG. 24 illustrates a flowchart explanatory of a method of fabricating a semiconductor device according to example embodiments of the inventive concept. The flowchart of FIG. 24 may for example include various processes as previously described with to reference to FIGS. 3-17.

Referring to FIG. 24, step S241 includes forming an insulating layer over a substrate. In some embodiments of the inventive concept, step S241 may include stacking the first mold film 210, the first supporter film 222, the second mold film 230 and the second supporter film 242 in sequence over the substrate 100 as shown and described with respect to at least FIG. 2 for example.

Referring further to FIG. 24, step S242 includes forming a first mask pattern on the insulating layer, and forming a second mask pattern on the first mask pattern. In some embodiments of the inventive concept, the first mask pattern and the second mask pattern may respectively correspond to first mask pattern 310 and second mask pattern 320 as shown and described with respect to at least FIG. 5.

Referring further to FIG. 24, step S243 includes forming a coating layer that covers an upper surface of the insulating layer, sidewalls of the first mask pattern, and the second mask pattern. In some embodiments of the inventive concept, the coating layer may correspond to coating layer 330 which covers an upper surface of the insulating layer (e.g., insulating layer 200), sidewalls of the first mask pattern 310, and the second mask pattern, as shown and described with respect to at least FIG. 6.

Referring further to FIG. 24, step S244 includes removing a portion of the coating layer and the second mask pattern. In some embodiments of the inventive concept, a portion of the coating layer 330 and the second mask pattern 320 shown in FIG. 6 are removed to provide remaining parts of coating layer 330 as shown and described with respect to at least FIGS. 7 and 8.

Referring further to FIG. 24, step S245 includes forming a metal layer on an upper surface of the first mask pattern and on sidewalls of the remaining parts of the coating layer. In some embodiments of the inventive concept, the metal layer may correspond to metal layer 340 as shown and described with respect to at least FIG. 9.

Referring further to FIG. 24, step S246 includes exposing the upper surface of the insulating layer by removing the remaining parts of the coating layer. In some embodiments of the inventive concept, this may be shown and described with respect to at least FIG. 10, wherein the remaining parts of the coating layer 330 shown in FIG. 9 are removed.

Referring further to FIG. 24, step S247 includes etching the insulating layer using the first mask pattern and the metal layer as a mask. In some embodiments of the inventive concept, this may be shown and described with respect to at least FIG. 11 whereby the first supporter film 222, the second mold film 230 and the second supporter film 242 are etched using the first mask pattern 310 and the metal layer 340 as a mask, and with respect to at least FIG. 13 whereby the first mold film 210 is etched using the first mask pattern 310 as a mask.

Although the embodiments of the inventive concept have been described above with reference to the accompanying drawings, the inventive concept is not limited to those embodiments, but may be manufactured in various different forms. It should be understood that a person skilled in the technical field that the inventive concept belongs to will be able to implement the inventive concept in different specific forms without changing the technical concept or the features of the inventive concept. Accordingly, should be understood that the embodiments described above are only illustrative, and should not be construed as limiting.

What is claimed is:

1. A method for fabricating a semiconductor device, comprising:
    forming an insulating layer over a substrate;
    forming a first mask pattern comprising silicon on the insulating layer and forming a second mask pattern comprising an oxide on the first mask pattern;
    forming a coating layer that comprises carbon and that covers an upper surface of the insulating layer exposed through the first and second mask patterns, sidewalls of the first mask pattern, and the second mask pattern;
    removing a portion of the coating layer and the second mask pattern to provide remaining parts of the coating layer;
    forming a metal layer on an upper surface of the first mask pattern, and on sidewalls of the remaining parts of the coating layer;
    exposing the upper surface of the insulating layer by removing the remaining parts of the coating layer; and
    etching the insulating layer using the first mask pattern and the metal layer as a mask.

2. The method of claim 1, wherein the forming the insulating layer comprises stacking a first mold film, a first supporter film, a second mold film, and a second supporter film over the substrate in sequence.

3. The method of claim 2, wherein the etching the insulating layer comprises:
    etching the second supporter film, the second mold film, and the first supporter film using the first mask pattern and the metal layer as the mask;
    exposing the upper surface of the first mask pattern by removing the metal layer; and
    etching the first mold film using the first mask pattern as another mask.

4. The method of claim 2, wherein the first mold film and the second mold film comprise an oxide, and the first supporter film and the second supporter film comprise a nitride.

5. The method of claim 1, wherein the removing the portion of the coating layer and the second mask pattern comprises:
    exposing an upper surface of the second mask pattern by performing an etch back on the coating layer; and
    exposing the upper surface of the first mask pattern by etching the second mask pattern.

6. The method of claim 1, wherein the forming the metal layer comprises forming the metal layer to cover the upper surface of the first mask pattern and portions of the sidewalls of the remaining parts of the coating layer by selectively depositing a metal on the first mask pattern.

7. The method of claim 1, wherein the forming the metal layer comprises:
    depositing a metal to completely cover the first mask pattern and the remaining parts of the coating layer; and
    exposing upper surfaces and portions of the sidewalls of the remaining parts of the coating layer, by etching a portion of the metal.

8. The method of claim 7, wherein the depositing the metal to completely cover the first mask pattern and the remaining parts of the coating layer comprises:
    conformally depositing a first metal on the first mask pattern and the remaining parts of the coating layer; and
    filling voids formed between the remaining parts of the coating layer with a second metal after said conformally depositing.

9. The method of claim 1, wherein the metal layer comprises at least one of tungsten (W), tungsten nitride (WN), tungsten carbide (WC), aluminium (Al), aluminium oxide ($Al_2O_3$), titanium (Ti), titanium oxide (TiO), tantalum (Ta), tantalum oxide (TaO), and tungsten silicon (WSi).

10. The method of claim 1, wherein the exposing the upper surface of the insulating layer by removing the remaining parts of the coating layer comprises removing the remaining parts of the coating layer by oxidizing the remaining parts of the coating layer using oxygen.

11. A method for fabricating a semiconductor device, comprising:
    forming an insulating layer comprising a first mold film, a first supporter film, a second mold film, and a second supporter film are stacked in sequence over a substrate;
    forming a first mask pattern on the insulating layer and forming a second mask pattern on the first mask pattern;
    forming a coating layer covering an upper surface of the insulating layer, a sidewall of the first mask pattern, and the second mask pattern;
    exposing a portion of a sidewall of the coating layer and an upper surface of the first mask pattern by removing a portion of the coating layer and the second mask pattern, to provide a remaining part of the coating layer;
    forming a metal layer on the upper surface of the first mask pattern;
    exposing the upper surface of the insulating layer by removing the remaining part of the coating layer;
    etching a portion of the insulating layer using the first mask pattern and the metal layer as a mask;
    exposing the upper surface of the first mask pattern by removing the metal layer; and
    forming a contact hole in the insulating layer by etching an other portion of the insulating layer using the first mask pattern as a mask.

12. The method of claim 11, further comprising:
    after the forming the contact hole, forming a lower electrode along an inner wall of the contact hole; and
    forming a sacrificial film on the lower electrode to fill the contact hole.

13. The method of claim 11, further comprising, after the forming the contact hole, forming a lower electrode to completely fill the contact hole.

14. The method of claim 11, wherein the exposing the upper surface of the insulating layer by removing the remaining part of the coating layer comprises removing the remaining part of the coating layer by oxidizing the remaining part of the coating layer using oxygen, the remaining part of the coating layer comprising carbon.

15. A method for fabricating a semiconductor device, comprising:
    forming an insulating layer on a substrate;
    forming a first mask pattern and a second mask pattern stacked on the insulating layer in sequence,
    each of the first mask pattern and the second mask pattern comprising a first opening, a second opening spaced apart from the first opening in a first direction, and a third opening spaced apart from the first opening in a second direction different from the first direction;

forming a coating layer comprising carbon to fill the first to third openings;

removing the second mask pattern;

forming a metal layer overlapping on the first mask pattern;

exposing an upper surface of the insulating layer through the first to third openings by removing the coating layer;

forming contact holes in the insulating layer using the first mask pattern and the metal layer as a mask; and forming lower electrodes in the contact holes.

16. The method of claim 15, wherein an angle formed by the first direction and the second direction is 90 degrees.

17. The method of claim 15, wherein an angle formed by the first direction and the second direction is an acute angle.

18. The method of claim 15, further comprising:
after the forming the lower electrodes, removing the first mask pattern; and
forming an open region for exposing portions of sidewalls of each of the lower electrodes by etching the insulating layer formed between the contact holes.

19. The method of claim 18, wherein a sidewall of the open region is formed along a virtual line of a circular shape.

20. The method of claim 18, wherein a sidewall of the open region is formed along a virtual line having a shape of a parallelogram.

* * * * *